(12) United States Patent
Mori

(10) Patent No.: US 7,636,263 B2
(45) Date of Patent: Dec. 22, 2009

(54) SEMICONDUCTOR MEMORY HAVING FUNCTION TO DETERMINE SEMICONDUCTOR LOW CURRENT

(75) Inventor: Toshiki Mori, Osaka (JP)

(73) Assignee: Panasonic Corporation, Osaka (JP)

( * ) Notice: Subject to any disclaimer, the term of this patent is extended or adjusted under 35 U.S.C. 154(b) by 133 days.

(21) Appl. No.: 11/905,646

(22) Filed: Oct. 3, 2007

(65) Prior Publication Data
US 2008/0170445 A1 Jul. 17, 2008

(30) Foreign Application Priority Data
Jan. 16, 2007 (JP) .............................. 2007-007239

(51) Int. Cl.
G11C 16/04 (2006.01)
(52) U.S. Cl. .................. 365/189.07; 365/189.09; 365/201; 365/207
(58) Field of Classification Search ............ 365/189.07, 365/189.09, 201, 185.21, 185.22, 185.18, 365/205, 207
See application file for complete search history.

(56) References Cited

U.S. PATENT DOCUMENTS

| | | | |
|---|---|---|---|
| 6,011,416 A | 1/2000 | Mizuno et al. | |
| 6,201,747 B1 | 3/2001 | Venkatesh et al. | |
| 6,370,061 B1 | 4/2002 | Yachareni et al. | |
| 6,807,097 B2 * | 10/2004 | Takano et al. | 365/185.03 |
| 6,891,768 B2 * | 5/2005 | Smith et al. | 365/207 |
| 7,405,988 B2 * | 7/2008 | Tran et al. | 365/208 |
| 7,477,559 B2 * | 1/2009 | Taddeo | 365/205 |

FOREIGN PATENT DOCUMENTS

| | | |
|---|---|---|
| JP | 6-251593 | 9/1994 |
| JP | 2005-302809 | 10/2005 |

* cited by examiner

Primary Examiner—David Lam
(74) Attorney, Agent, or Firm—McDermott Will & Emery LLP

(57) ABSTRACT

A semiconductor memory, including word lines, bit lines, memory cells provided at intersections between the word lines and bit lines, and a sense amplifier for reading out what is stored in the memory cells, bit line selection means for selecting a bit line from among the bit lines; switch means for turning ON/OFF a current of the bit line selected by the bit line selection means; current generation means for generating a threshold current; means for extracting a differential current between the selected bit line current and the threshold current when a value of the selected bit line current is greater than that of the threshold current; voltage conversion means for converting the differential current to a voltage; and determination means for determining a magnitude relationship between the threshold current and the selected bit line current based on an output voltage from the voltage conversion means.

41 Claims, 17 Drawing Sheets

SEMICONDUCTOR MEMORY HAVING FUNCTION TO DETERMINE SEMICONDUCTOR LOW CURRENT

CROSS REFERENCE TO RELATED APPLICATION

This application claims priority under 35 U.S.C. §119 on Patent Application No. 2007-007239 filed in Japan on Jan. 16, 2007, the entire contents of which are hereby incorporated by reference.

BACKGROUND OF THE INVENTION

The present invention relates to a method and a device for determining a semiconductor low current (e.g., a bit line leak current in a semiconductor memory such as a flash memory).

In recent years, a non-volatile memory such as a flash memory and an EEPROM employs a large-capacity memory array configuration using miniaturized memory cells.

One of the problems that recent non-volatile memories are facing is the increase in the bit line leak current due to an increase in the memory array capacity. This is because of the increase in the number of memory cells per bit line, in addition to the increase in the leak current (bit line leak current) per memory cell, which is caused by the miniaturization process. An increase in the bit line leak current influences the memory cell read operation, thereby detracting from the precision of the memory cell threshold value control and thus deteriorating the reliability, e.g., the data holding property.

The write/erase operation for a non-volatile memory cell is controlled by repeatedly performing the operation of changing the threshold value of the memory cell by applying a write/erase bias and the threshold value determination, i.e., a verifying operation of determining the cell current. In a verifying operation, a bit line leak current causes the system to erroneously determine the cell current by the magnitude of the leak current, thereby leading to overwriting, undererasing, etc., thus preventing the system from normally controlling the threshold value of a memory cell.

In order to realize a high reliability of a memory, any bit line whose leak is determined to be greater than or equal to a predetermined value in a device test needs to be replaced by redundant replacement, or the device needs to be rejected as being a defective device. Conventional bit line leak current determination for leak currents on the order of μA used a sense amplifier, which is for use in the read operation.

Patent Document 1, identified below, describes the determination of the bit line leak current with a sense amplifier. Patent Document 2 describes a method for directly measuring a leak current, Patent Document 3 a method for measuring the threshold value of a cell, and Patent Document 4 a method for on-chip current measurement.

Patent Document 1: Japanese Laid-Open Patent Publication No. 6-251593

Patent Document 2: U.S. Pat. No. 6,201,747

Patent Document 3: U.S. Pat. No. 6,370,061

Patent Document 4: Laid-Open Patent Publication No. 2005-302809

However, the decrease in the cell current due to miniaturization of memory cells, the demand for improving the number of write cycles, the increase in the number of threshold values, etc., make it necessary to improve the precision of the threshold value control, and there is accordingly a demand for determining even lower currents, i.e., on the sub-μA level. In the conventional measurement of such low currents, bit lines are selectively drawn directly onto external pads and the currents are measured by a current measurement option of a test apparatus.

FIG. 20 shows a configuration of a conventional memory having a bit line leak current measurement function. A memory 100 includes a data storage section 102 for writing/reading data, a switch 2000 for connecting a selected bit line in the data storage section 102 to an external terminal 110 via a node 108 for measuring the current of the bit line, and a control circuit 104 for controlling the data storage section 102 and the switch 2000.

When determining a leak current of a bit line, memory cells in the data storage section 102 are controlled by the control circuit 104 to be unselected. The switch 2000 connects the node 108, to which a selected bit line is connected, to the external terminal 110. Then, the current value is measured by a current measurement option of a test apparatus connected to the external terminal 110.

FIG. 21 shows an exemplary circuit configuration of a main part of the memory 100 in a case where a virtual ground array (VGA) configuration, which is suitable for large-capacity memories, is applied to the data storage section 102.

A memory cell array 801 includes memory cells arranged in a matrix pattern, wherein gates of memory cells of the same row are connected together and to word lines WL0 and WL1, sources of memory cells of the same column are connected together and to source bit lines BL0 and BL2, which give a source potential, and drains of memory cells of the same column are connected together and to a drain bit line BL1, which give a drain potential.

Methods for reading out stored data from a memory cell include a drain read method of determining the current or level on the drain side of the memory cell, and a source read method of determining the current or level on the source side of the memory cell. The mainstream is the source read method, with which the influence of the memory cell leak current is-smaller and the power consumption can be suppressed smaller, and FIG. 21 shows an example of the source read method.

A column selection gate (D) 804 is a selection gate for selecting a drain bit line, to which the drain of the memory cell is connected, and gives a read voltage (about 1.3 V) according to the potential VBLR, via a bias transistor 808, to the drain bit line selected by the selection gate connected to a selection signal YGD1. A column selection gate (S) 802 is a selection gate for selecting a source bit line, to which the source of the memory cell is connected, and selectively connects the source bit line selected by the selection gates connected to selection signals YGS1 and YGS2 to the node 108, at which a sense amplifier 810, a reset transistor 806 and the switch 2000 are connected together.

FIG. 22 shows a timing waveform of the operation of reading out data stored in a memory cell. In the period until time t1 where the signal SEN is "H", the transistor 806 is ON, and the potential VBL at the node 108 remains at the GND level. When the signal SEN transitions to the "L" level at time t1, the transistor 806 is turned OFF, and the node 108 is charged by the current of the selected memory cell. Where the selected memory cell is ON (i.e., it is an ON-cell), the potential of the node 108 increases as shown in (VBL_1). However, where the selected memory cell is OFF (i.e., it is an OFF-cell), the potential of the node 108 remains at the ground potential as shown in (VBL_2). A read reference current being about ½ the current of an ON memory cell flows from a circuit (not shown) to the reference node being the other input of the sense amplifier 810, thereby charging the reference node.

Thus, the potential VREF of the reference node is a middle potential between (VBL_1) and (VBL_2), as shown in FIG. 22.

At time t2, when the potential difference between the potential VBL of the source node of the memory cell and the potential VREF of the reference node has increased sufficiently, the determination output Sout from the sense amplifier 810 is decided as being the read data from the memory cell, thus completing the read operation, after which the signal SEN is brought to the "H" level to discharge the node 108.

Where there is a leak current on the source bit line BL0 or BL2, to which the source of the memory cell is connected, the leak current is added to the memory cell current, and the potentials of (VBL_1) and (VBL_2) are increased. Then, the potential difference between the potential (VBL_2) where the selected memory cell is OFF and the potential (VREF) of the reference node decreases, thereby reducing the read margin.

Thus, during the product inspection stage of the production process, it is necessary to determine the leak current value of each bit line, and if there is a leak greater than or equal to a predetermined value, the bit line needs to be replaced by redundant replacement, or the device needs to be rejected as being a defective device.

Therefore, for the purpose of bit line leak current determination, the switch 2000 is provided, which connects the VBL node 108 to the external terminal 110. In the bit line leak determination, under control of the control circuit 104, the ground potential representing the "unselected state" is given to all word lines WL0 and WL1, and the column selection gate (D) 804 and the column selection gate (S) 802 select a drain bit line and a source bit line, respectively, whose leak is to be determined, thereby selecting a group of memory cells (a column of memory cells) whose leak is to be determined.

A read voltage of about 1.3 V is given to the selected drain bit line via the bias transistor 808 as in a read operation, and the node 108, to which the selected source bit line is output, is connected to the external terminal 110 via the switch 2000. A current measurement option of the test apparatus is connected to the external terminal 110 to measure the leak current of the selected bit line.

The current measurement of the test apparatus is relatively slow, taking an amount of time on the order of ms to 10 ms per an iteration of current measurement, whereby a test time generally on the order of 10 seconds is required for measuring all of the thousands of bit lines forming the memory array, greatly affecting the testing cost. It is often the case with test apparatuses that parallel testing is employed for reducing the effective test time in order to improve the throughput or reduce the testing cost. However, such parallel measurement requires the test apparatus to have an independent test resource for each device, thus resulting in an expensive test apparatus.

In order to avoid such a problem, the present inventors have proposed means for on-chip determination of the bit line leak current, wherein an external reference current is compared with the leak current of a selected bit line in terms of a voltage value obtained by integrating the current by means of a capacitor.

However, it has been found that the bit line leak determination has the following problem. With a memory of a virtual ground array arrangement using a source read method as shown in FIG. 21, the source bit line leak current is quite dependent on the potential applied to the source of the memory cell as shown in FIG. 23. In other words, the value of the source bit line leak current rapidly decreases as the source potential increases.

Therefore, where the conventional bit line leak determination is applied to a memory of a virtual ground array arrangement using a source read method, the leak current-integrated voltage is applied to the source of the memory cell, and the leak current value decreases according to the voltage, whereby it is difficult to determine the bit line leak current with high precision.

As described above, while a non-volatile memory made by a minute process requires a bit line leak current determination in order to realize high reliability, a determination by using a current measurement option of a test apparatus increases testing costs, such as the test time and the cost and the throughput of the test apparatus. Moreover, conventional on-chip bit line leak current determination means cannot determine a leak current with high precision.

SUMMARY OF THE INVENTION

It is an object of the present invention to provide a method and a device for determining a semiconductor low current, capable of on-chip, high-precision determination of a bit line current greater than or equal to a predetermined value, and to provide a semiconductor memory including such bit line current determination means.

A semiconductor memory of the present invention is a semiconductor memory, including a plurality of word lines, a plurality of bit lines, a plurality of memory cells provided at intersections between the plurality of word lines and the plurality of bit lines, and a sense amplifier for reading out what is stored in the memory cells, the semiconductor memory including:

bit line selection means for selecting a bit line from among the plurality of bit lines;

switch means for turning ON/OFF a current of the bit line selected by the bit line selection means;

current generation means for generating a threshold current;

means for extracting a differential current between the selected bit line current and the threshold current when a value of the selected bit line current is greater than that of the threshold current;

voltage conversion means for converting the differential current to a voltage; and; and determination means for determining a magnitude relationship between the threshold current and the selected bit line current based on an output voltage from the voltage conversion means.

With this semiconductor memory, the differential current between the bit line current and the threshold current is converted to a voltage, which is subjected to a determination, whereby it is possible to suppress the voltage value used for the determination to be low, and it is therefore possible to realize a bit line leak determination with high precision.

Another semiconductor memory of the present invention is a semiconductor memory, including a plurality of word lines, a plurality of bit lines, a plurality of memory cells provided at intersections between the plurality of word lines and the plurality of bit lines, and a sense amplifier for reading out what is stored in the memory cells, the semiconductor memory including:

bit line selection means for selecting a bit line from among the plurality of bit lines;

switch means for turning ON/OFF a current of the bit line selected by the bit line selection means;

current generation means for generating a threshold current;

means for extracting a differential current between the selected bit line current and the threshold current when a value of the selected bit line current is greater than that of the threshold current;

first voltage conversion means for converting the differential current to a voltage;

second voltage conversion means for converting an output from the first voltage conversion means; and determination means for determining a magnitude relationship between the threshold current and the selected bit line current based on an output voltage from the second voltage conversion means.

With this semiconductor memory, the level of the voltage obtained by converting the differential current between the bit line current and the threshold current is converted to a voltage level such that the determination circuit can operate stably, whereby it is possible to realize a stable leak current determination with high precision.

Another semiconductor memory of the present invention is a semiconductor memory, including a plurality of word lines, a plurality of bit lines, a plurality of memory cells provided at intersections between the plurality of word lines and the plurality of bit lines, and a sense amplifier for reading out what is stored in the memory cells, the semiconductor memory including:

bit line selection means for selecting a bit line from among the plurality of bit lines;

switch means for turning ON/OFF a current of the bit line selected by the bit line selection means;

current generation means for generating a threshold current;

means for extracting a differential current between the selected bit line current and the threshold current when a value of the selected bit line current is greater than that of the threshold current;

first voltage conversion means for converting the differential current to a voltage;

second voltage conversion means for converting an output from the first voltage conversion means;

switching means for switching a reference voltage of the sense amplifier from one to another; and determination means for determining a magnitude relationship between the threshold current and the selected bit line current based on an output voltage from the second voltage conversion means.

With this semiconductor memory, it is possible to perform a bit line current determination using a sense amplifier designed for reading out stored data, whereby it is possible to realize a high-speed leak current determination for a plurality of bit lines.

A determination method of the present invention is a method for determining a bit line current of a semiconductor memory, the semiconductor memory including:

a plurality of word lines;

a plurality of bit lines;

a memory cell array of a virtual ground array arrangement including a plurality of memory cells provided at intersections between the plurality of word lines and the plurality of bit lines;

first bit line selection means for selecting a bit line to which a drain of the memory cell is connected;

second bit line selection means for selecting a bit line to which a source of the memory cell is connected; and a sense amplifier for reading out what is stored in the memory cell connected to an output of the second bit line selection means, the method including:

a first bit line selection step of selecting, by means of the first bit line selection means, a bit line to which a drain of the memory cell is connected according to an input address;

a second bit line selection step of selecting, by means of the second bit line selection means, a bit line to which a source of the memory cell is connected according to the input address;

a step of grounding the bit line selected by the second bit line selection step; and a step of determining a magnitude of a current flowing through the bit line selected by the first bit line selection step.

With this bit line current determination method, it is possible to realize, in a memory of a virtual ground array arrangement employing the source read method, a bit line current determination with high precision such that the influence from a voltage for the bit line current determination is suppressed.

Another semiconductor memory of the present invention is a semiconductor memory, including: a plurality of word lines; a plurality of bit lines; and a memory cell array of a virtual ground array arrangement including a plurality of memory cells provided at intersections between the plurality of word lines and the plurality of bit lines, the semiconductor memory including:

first bit line selection means for selecting a bit line to which a drain of the memory cell is connected according to an input address;

second bit line selection means for selecting a bit line to which a source of the memory cell is connected according to the input address;

a sense amplifier for reading out what is stored in the memory cell connected to an output of the second bit line selection means;

means for grounding the bit line selected by the second bit line selection means; and means for determining a magnitude of a current flowing through the bit line selected by the first bit line selection means.

With this semiconductor memory, it is possible to realize, in a memory of a virtual ground array arrangement employing the source read method, a determination of a low leak current with high precision while suppressing the influence from a voltage for the bit line current determination.

Another determination method of the present invention is a semiconductor low current determination method for comparing a magnitude of a threshold current with that of a current being measured, the method including:

a step (a) of turning ON/OFF the current being measured;

a step (b) of generating the threshold current;

a step (c) of extracting a differential current between the current being measured and the threshold current when a value of the current being measured is greater than that of the threshold current; and a step (d) of sensing the differential current to determine a magnitude relationship between a value of the current being measured and that of the threshold current.

Instead of comparing the value of the current being measured with that of the threshold current, this determination method extracts the differential current between the current being measured and the threshold current for performing a low current determination only when the current being measured is greater than the threshold current, whereby it is possible to realize a low current determination with high precision.

A determination device of the present invention is a semiconductor low current determination device for comparing a magnitude of a threshold current with that of a current being measured, the device including:

switch means for turning ON/OFF the current being measured;

current generation means for generating a threshold current;

means for extracting a differential current between the current being measured and the threshold current when a value of the current being measured is greater than that of the threshold current;

voltage conversion means for converting the differential current to a voltage; and determination means for determining a magnitude relationship between the threshold current and the current being measured based on an output voltage from the voltage conversion means.

Instead of comparing the value of the current being measured with that of the threshold current, this determination device extracts the differential current between the current being measured and the threshold current for performing a low current determination only when the current being measured is greater than the threshold current, whereby it is possible to realize with a simple configuration a low current determination with high precision.

Another determination device of the present invention is a semiconductor low current determination device for comparing a magnitude of a threshold current with that of a current being measured, the device including:

first switch means for turning ON/OFF a connection between a first node through which a first current flows and a second node through which a second current flows;

voltage conversion means connected at a connection point between the second node and the first switch means; and a comparator connected to the voltage conversion means.

Instead of comparing the current value of the first node with that of the second node, this determination device extracts the differential current between the current value of the first node and that of the second node for performing a low current determination, whereby it is possible to realize with a simple configuration a low current determination with high precision.

DETAILED DESCRIPTION OF THE PREFERRED EMBODIMENTS

Figure 1:
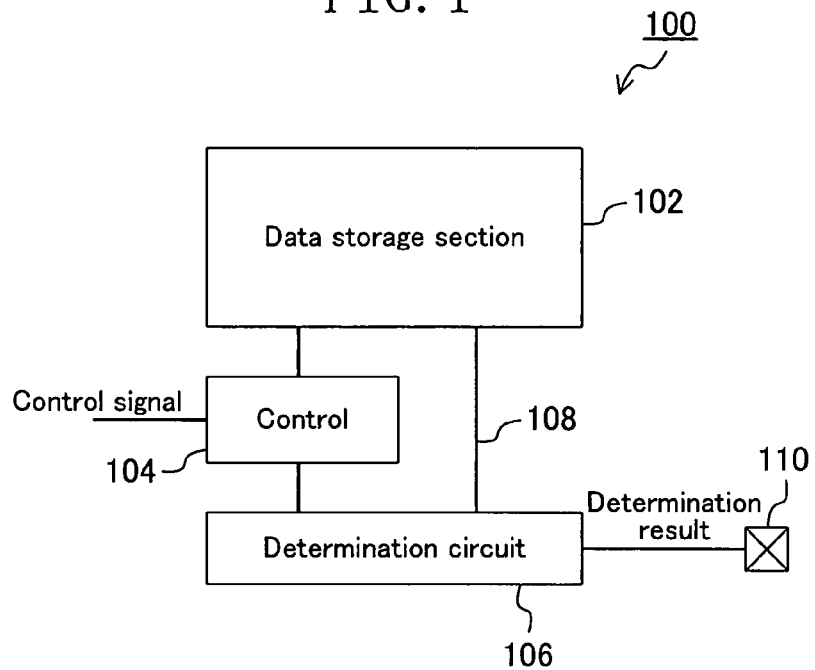
FIG. 1 is a schematic block diagram of a semiconductor memory according to Embodiment 1 of the present invention.

Embodiments of the present invention will now be described with reference to the drawings. The following embodiments are merely illustrative, and the present invention is not limited thereto. Like elements are denoted by like reference numerals throughout the drawings.

Embodiment 1

Figure 20:
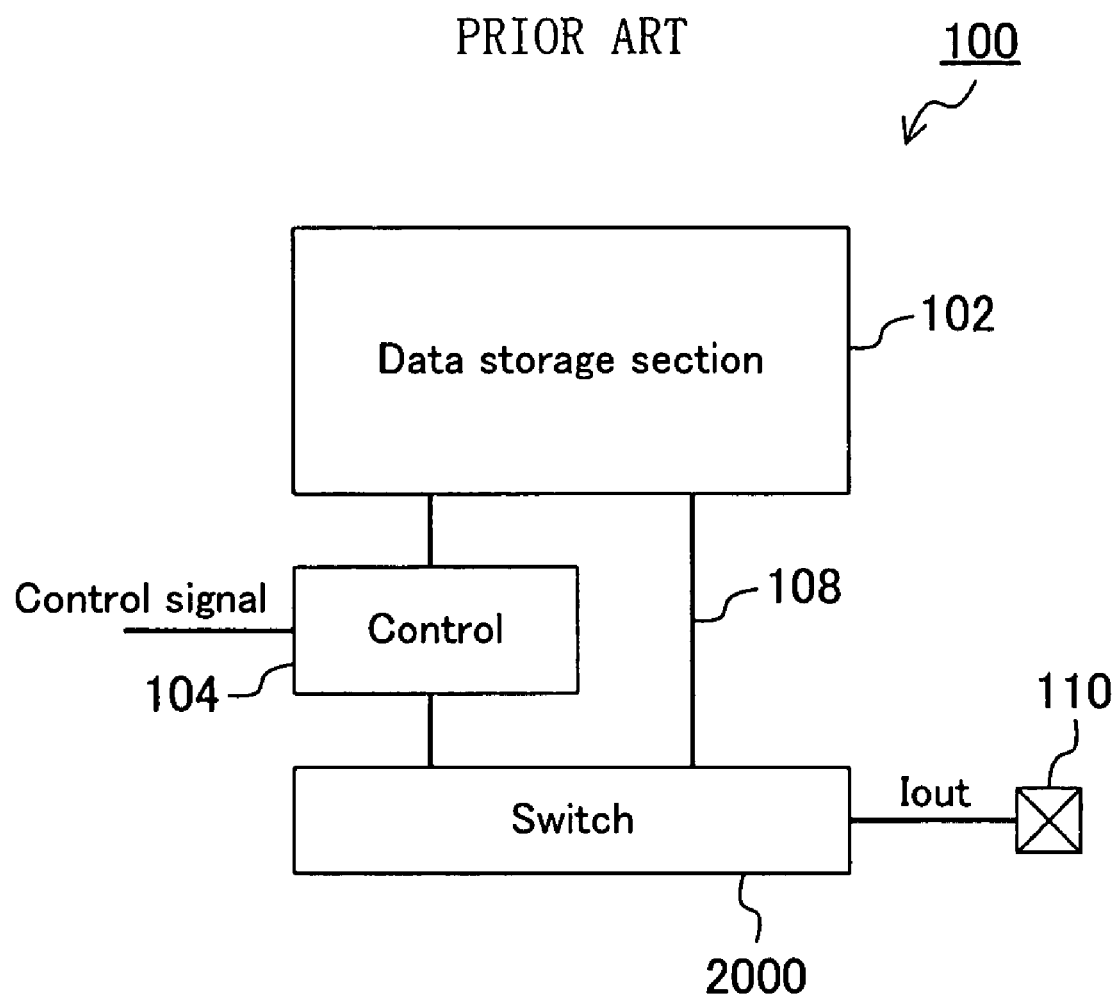
FIG. 20 is a schematic block diagram showing a conventional semiconductor memory.

FIG. 1 is a schematic block diagram of a semiconductor memory according to Embodiment 1 of the present invention. Referring to FIG. 1, the semiconductor memory of the present embodiment is different from the conventional semiconductor memory shown in FIG. 20 in that the node 108, to which a bit line from the data storage section 102 is selectively connected, is connected to a determination circuit 106 for determining the bit line leak current, and that the leak current value determined by the determination circuit 106 is output to the external terminal 110.

Figure 2:
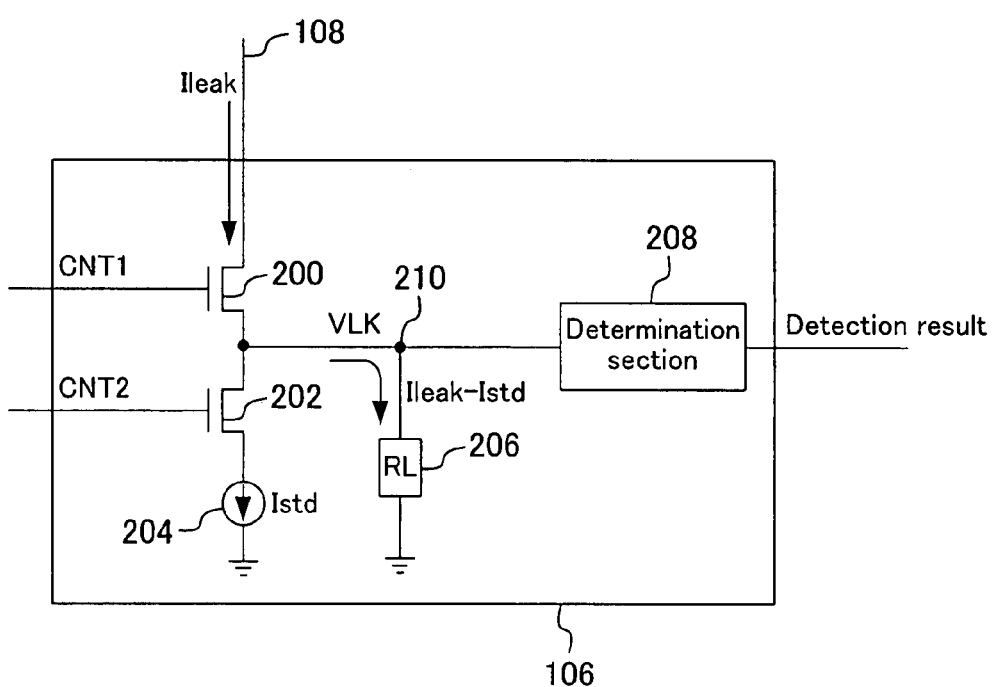
FIG. 2 is an exemplary circuit diagram of a current determination circuit shown in FIG. 1.
Figure 3:
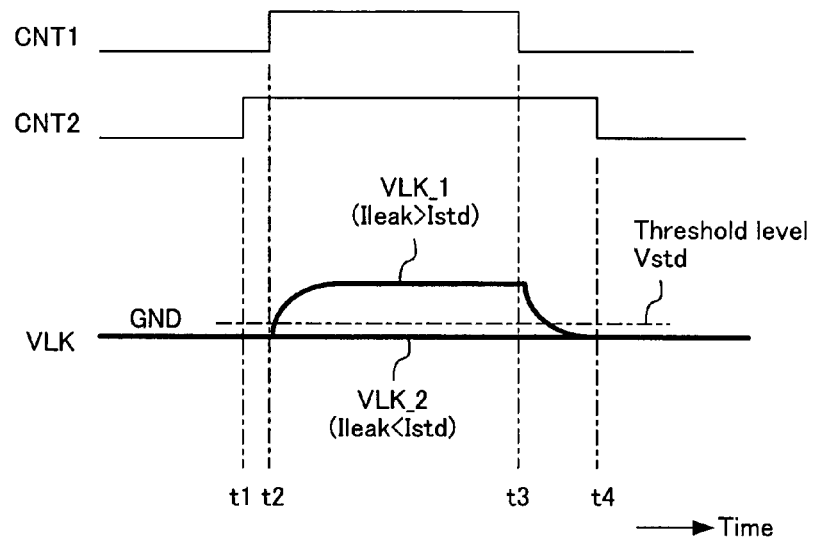
FIG. 3 is an operation timing diagram of the exemplary current determination circuit shown in FIG. 2.

FIG. 2 shows an exemplary circuit configuration of the determination circuit 106, and FIG. 3 shows a timing diagram of the leak current determination. During the bit line leak determination operation, the bias conditions, etc., of the data storage section 102 are set to those of the leak determination mode under control of the control circuit 104, and the leak current Ileak of the selected bit line flows into the leak determination circuit 106 via the node 108. A reference current source 204 is for generating a bit line leak threshold current Istd, and generates the reference current based on the reference voltage used in the internal memory circuit, etc. The selected source bit line node 108 of the data storage section 102 and the reference current source 204 are connected to each other via transistors 200 and 202, which are turned ON/OFF by control signals CNT1 and CNT2, respectively, from the control circuit 104.

As shown in the operation timing diagram of FIG. 3, before time t1 at which the bit line leak determination operation starts, the control signals CNT1 and CNT2 are both at the "L" level, whereby the transistors 200 and 202 are both OFF.

At time t1, when the bit line leak determination operation starts, the control signal CNT2 transitions to the "H" level, thus turning ON the transistor 202, whereby a potential VLK of a node 210, to which one end of a resistor 206 is connected, is discharged to the ground potential by the reference current source 204.

At time t2, the control signal CNT1 transitions to the "H" level, thus turning ON the transistor 200, whereby the leak current Ileak of the selected bit line from the data storage section 102 is connected to the threshold current Istd flowing in the current source 204.

Figure 4:
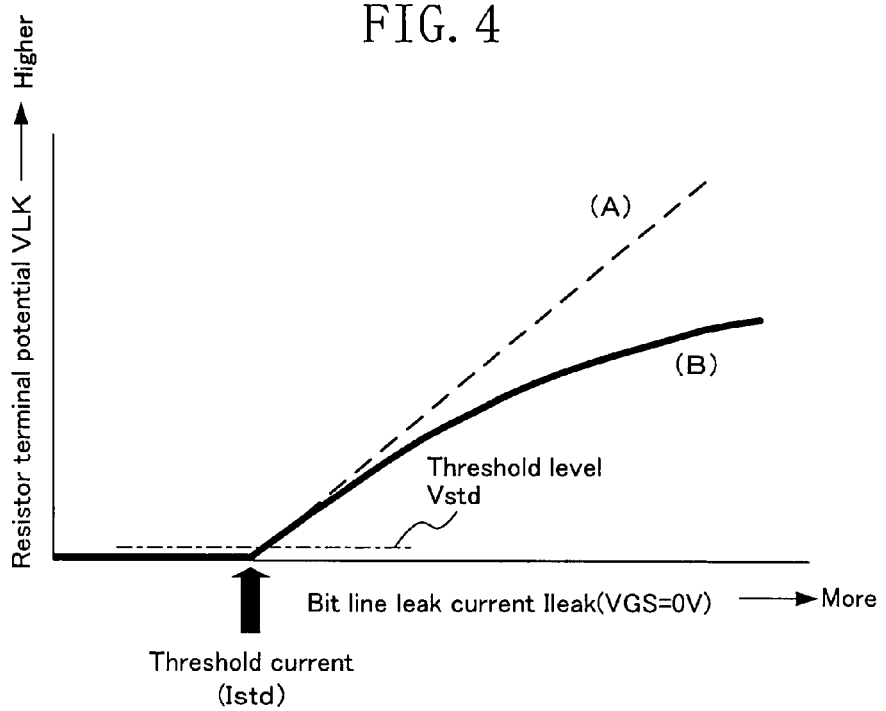
FIG. 4 shows the current-voltage conversion characteristics of the exemplary current determination circuit shown in FIG. 2.

FIG. 4 shows how the resistor terminal potential (the potential of the node 210 to which one end of the resistor 206 is connected) VLK is dependent on the leak current value Ileak, where the transistors 200 and 202 are both ON, wherein the bit line leak current Ileak (VGS=0V) along the horizontal axis represents the leak current value where the gate and the source of the memory cell are both 0 V. As shown in FIG. 4, in the range where the leak current Ileak of the selected bit line is less than the threshold current Istd, all of the leak current Ileak flows into the current source 204, whereby the resistor terminal potential VLK is at the ground potential.

Figure 21:
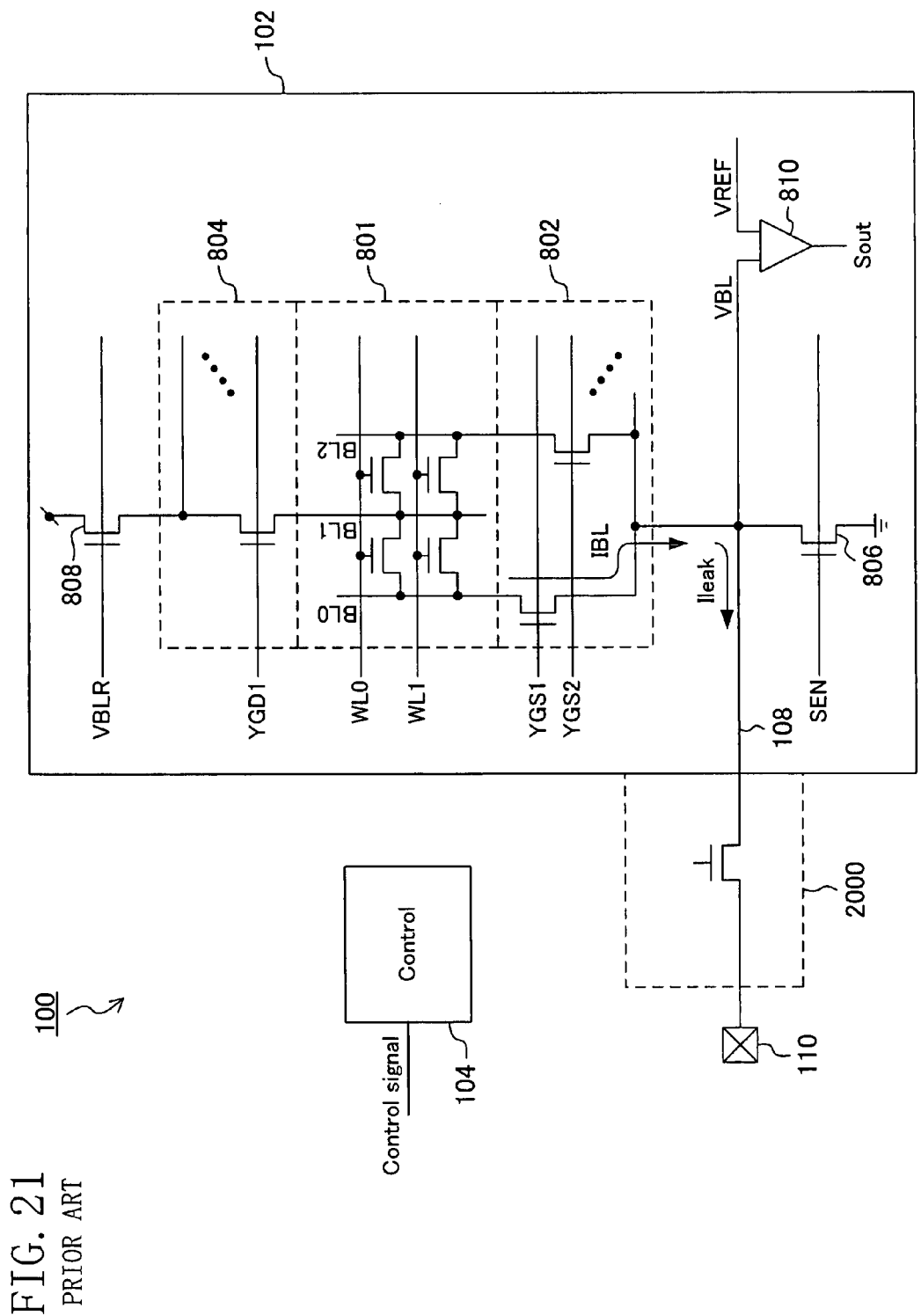
FIG. 21 is an exemplary schematic circuit diagram of a main part of the semiconductor memory shown in FIG. 20.
Figure 22:
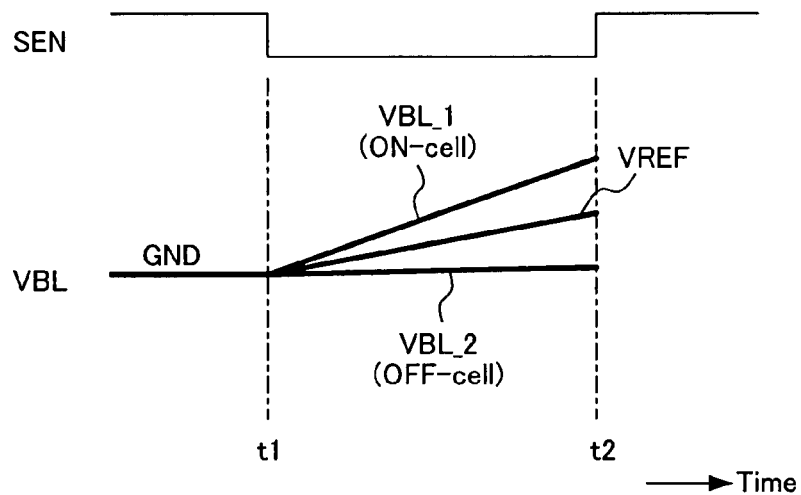
FIG. 22 is a timing diagram of the stored data reading operation of the semiconductor memory shown in FIG. 21.
Figure 23:
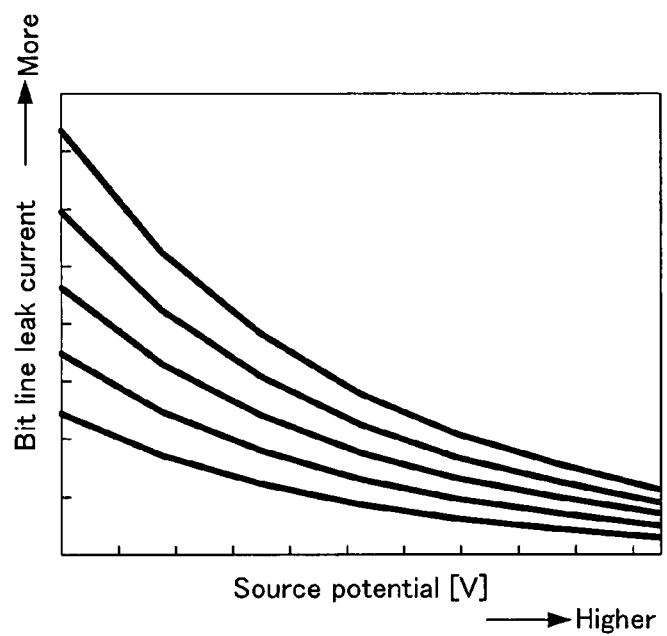
FIG. 23 shows the source potential dependency of the bit line leak current value of the semiconductor memory shown in FIG. 21.

When the leak current Ileak of the selected bit line becomes greater than the threshold current Istd, the difference (Ileak–Istd) between the leak current Ileak and the threshold current Istd flows into the resistor 206, whereby the resistor terminal potential VLK increases according to the leak current value.

Where the virtual ground array arrangement shown in FIG. 21 is used as the memory cell array in the data storage section 102 and the selected bit line is a source bit line, the resistor terminal potential VLK in a range where the leak current Ileak is greater than the threshold current Istd does not linearly increase in direct proportion to the leak current value as shown by the broken line (A) in FIG. 4, but gradually saturates as the leak current value increases as shown by the solid line (B) in FIG. 4.

This is because the increase in the resistor terminal potential VLK pushes up the source potential of the memory cell, whereby the leak current decreases under the operating bias conditions.

Thus, the resistor terminal potential VLK in the exemplary circuit configuration shown in FIG. 2 only increases when the leak current Ileak of the selected source bit line is greater than the threshold current Istd. Therefore, the value of the resistor terminal potential VLK as shown in FIG. 3 during the period t2-t3 is equal to the potential VLK_1 if the leak current Ileak is greater than the threshold current Istd and to the potential VLK_2 (the ground potential GND) if the leak current Ileak is less than the threshold current Istd. It is possible to determine whether the leak current value of the selected bit line is greater than the threshold current Istd by comparing the resistor terminal potential VLK (VLK_1 or VLK_2) with the threshold level Vstd of FIG. 3 by means of a determination section 208.

Upon completion of the leak current determination operation, the control signals CNT1 and CNT2 are successively transitioned to the "L" level at times t3 and t4, respectively, thus turning OFF the transistor 200, and the charge of the node 210 is pulled out by the transistor 202, after which the leak current determination operation cycle ends.

The series of operations are repeated for all the bit lines in the data storage section 102, thus performing the leak current determination operation for all the bit lines.

Embodiment 2

There is a demand for sub-μA current values to be used in the bit line leak determination, and there is a concern for erroneous operations due to noise when a circuit operates to make determinations on such low currents.

Figure 5:
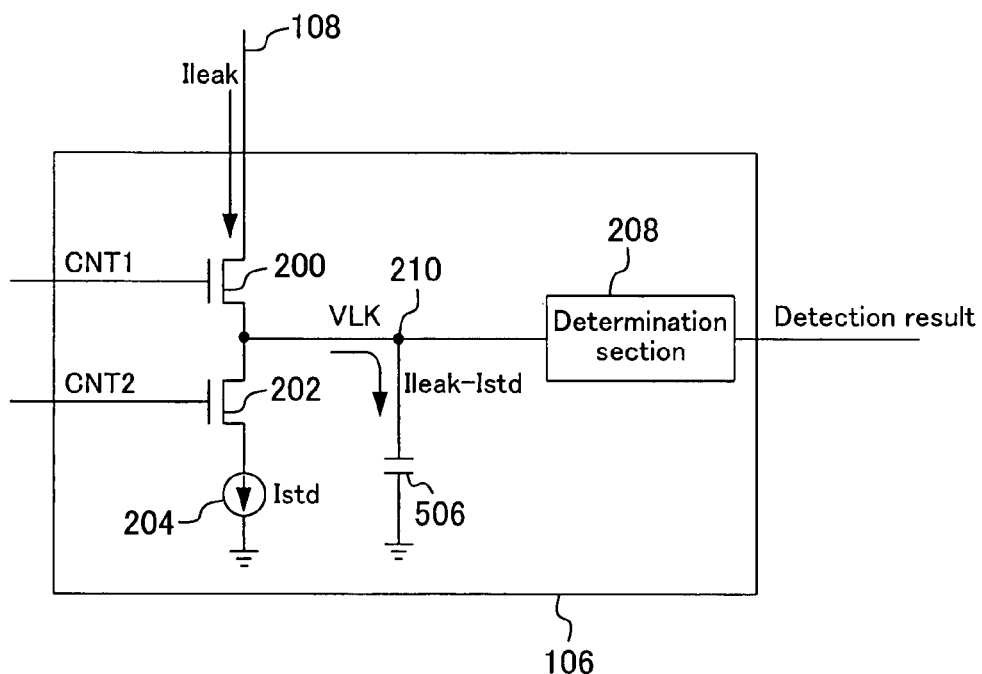
FIG. 5 is an exemplary circuit diagram of a current determination circuit according to Embodiment 2 of the present invention.

FIG. 5 is an exemplary circuit configuration of the determination circuit 106, in which a capacitor 506 is used to implement means for converting the differential current (Ileak–Istd) between the leak current Ileak and the threshold current Istd to a voltage, whereby erroneous operations due to noise are suppressed while reducing the layout size. The determination circuit 106 shown in FIG. 5 is different from that shown in FIG. 2 in that the capacitor 506 is the destination to which the differential current (Ileak–Istd) flows when the leak current Ileak of the selected bit line is greater than the threshold current Istd.

Figure 6:
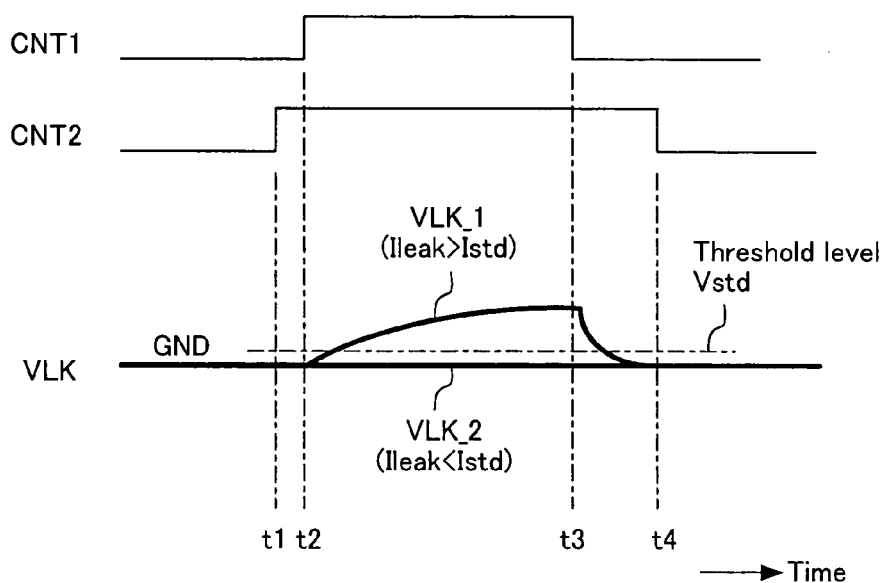
FIG. 6 is an operation timing diagram of the exemplary current determination circuit shown in FIG. 5.

FIG. 6 shows a timing diagram of the leak current determination operation. As shown in FIG. 6, the control signals CNT1 and CNT2 are input with similar timing waveforms to those shown in FIG. 3, to thereby turn ON/OFF the transistors 200 and 202.

As described above with reference to FIG. 3, before time t1 at which the bit line leak determination operation starts, the control signals CNT1 and CNT2 are both at the "L" level, whereby the transistors 200 and 202 are both OFF.

At time t1, when the bit line leak determination operation starts, the control signal CNT2 transitions to the "H" level, thus turning ON the transistor 202, whereby the potential VLK of the node 210, to which one end of the capacitor 506 is connected, is discharged to the ground potential by the reference current source 204.

At time t2, the transistor 200 is turned ON, whereby the leak current Ileak of the selected bit line from the data storage section 102 is connected to the threshold current Istd flowing in the current source 204. In the range where the leak current Ileak is less than the threshold current Istd, all of the leak current Ileak flows into the reference current source 204, whereby the capacitor terminal potential VLK (the potential of the node 210 to which one end of the capacitor 506 is connected) is equal to the ground potential as shown in (VLK_2).

When the leak current Ileak becomes greater than the threshold current Istd, the difference (Ileak–Istd) between the leak current Ileak and the threshold current Istd flows into the capacitor 506, whereby the capacitor terminal potential VLK increases according to the leak current value as shown in (VLK_1).

Figure 7:
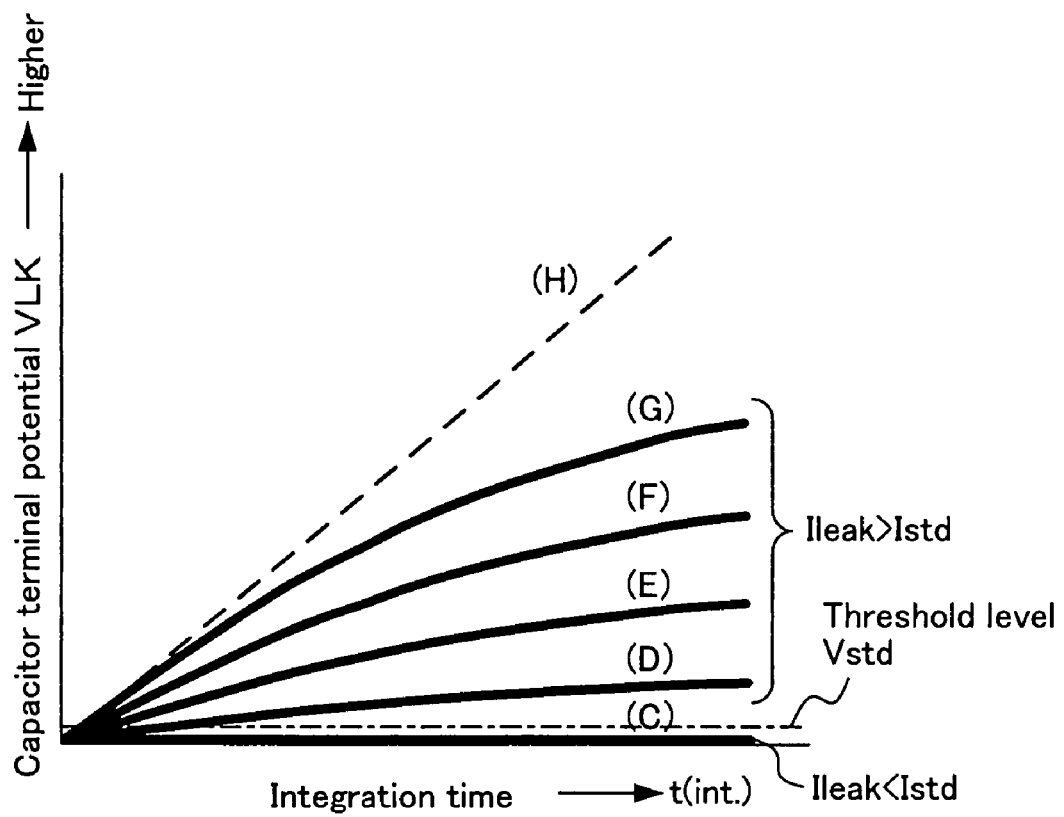
FIG. 7 shows the current-voltage conversion characteristics of the exemplary current determination circuit shown in FIG. 5.

FIG. 7 shows how the capacitor terminal potential VLK is dependent on the differential current (Ileak–Istd) value, where the integration time t (int.) is the amount of time the differential current (Ileak–Istd) flows into the capacitor 506.

The straight line (c) shown in FIG. 7 represents a case where the leak current Ileak is less than the threshold current Istd, in which case the capacitor terminal potential VLK remains at the ground potential without being dependent on the value of the leak current Ileak. The curves (D) to (G)

represent cases where the leak current Ileak is greater than the threshold current Istd, wherein the leak currents Ileak are gradually higher in the order of from (D) to (G).

Where CL denotes the capacitance value of the capacitor 506 and it is assumed that the differential current (Ileak−Istd) value is constant, the capacitor terminal potential VLK is as shown in Expression 1 below, which represents a straight line as shown in the straight line (H). However, where the virtual ground array arrangement shown in FIG. 21 is used as the memory cell array in the data storage section 102 and the selected bit line is a source bit line, as described above with reference to FIG. 4, the capacitor terminal potential VLK is as shown in the curves (D) to (G) due to the source potential dependency of the leak current.

$$VLK = (Ileak - Istd)/CL \times t(int.) \qquad \text{(Expression 1)}$$

It is possible to determine whether the leak current value of the selected source bit line is greater than the threshold current Istd by comparing the capacitor terminal potential VLK (VLK_1 or VLK_2) shown in FIG. 6 with the threshold level Vstd of FIG. 6 by means of the determination section 208.

As means for converting the differential current (Ileak−Istd) to a voltage, the differential current (Ileak−Istd) may be integrated by using the capacitor 506, whereby it is possible to generate a differential voltage necessary for the determination even if the differential current (Ileak−Istd) is of a very small value, and thus to realize a determination circuit with high precision.

Moreover, as compared with cases where high resistors are used, a smaller layout size can be realized, thus making it possible to reduce the cost.

Embodiment 3

The threshold voltage in the determination section 208 in Embodiments 1 and 2 is a value obtained by converting the differential current (Ileak−Istd) between the leak current Ileak and the threshold current Istd to a voltage, and the potential thereof increases off the ground potential only when the leak current Ileak is greater than the threshold current Istd. Therefore, in order to increase the determination precision, it is preferred that Vstd being the threshold level is compared with the converted voltage while setting Vstd to be as close to the ground potential as possible.

However, in order to compare a potential close to the ground potential, the determination section 208 needs to be a circuit that precisely responds to an input signal close to the ground potential. It is generally difficult to ensure a sufficient circuit operation margin with such a circuit operation with an input signal level close to the ground potential, and it is not suitable for making improvements in the determination precision.

Figure 8:
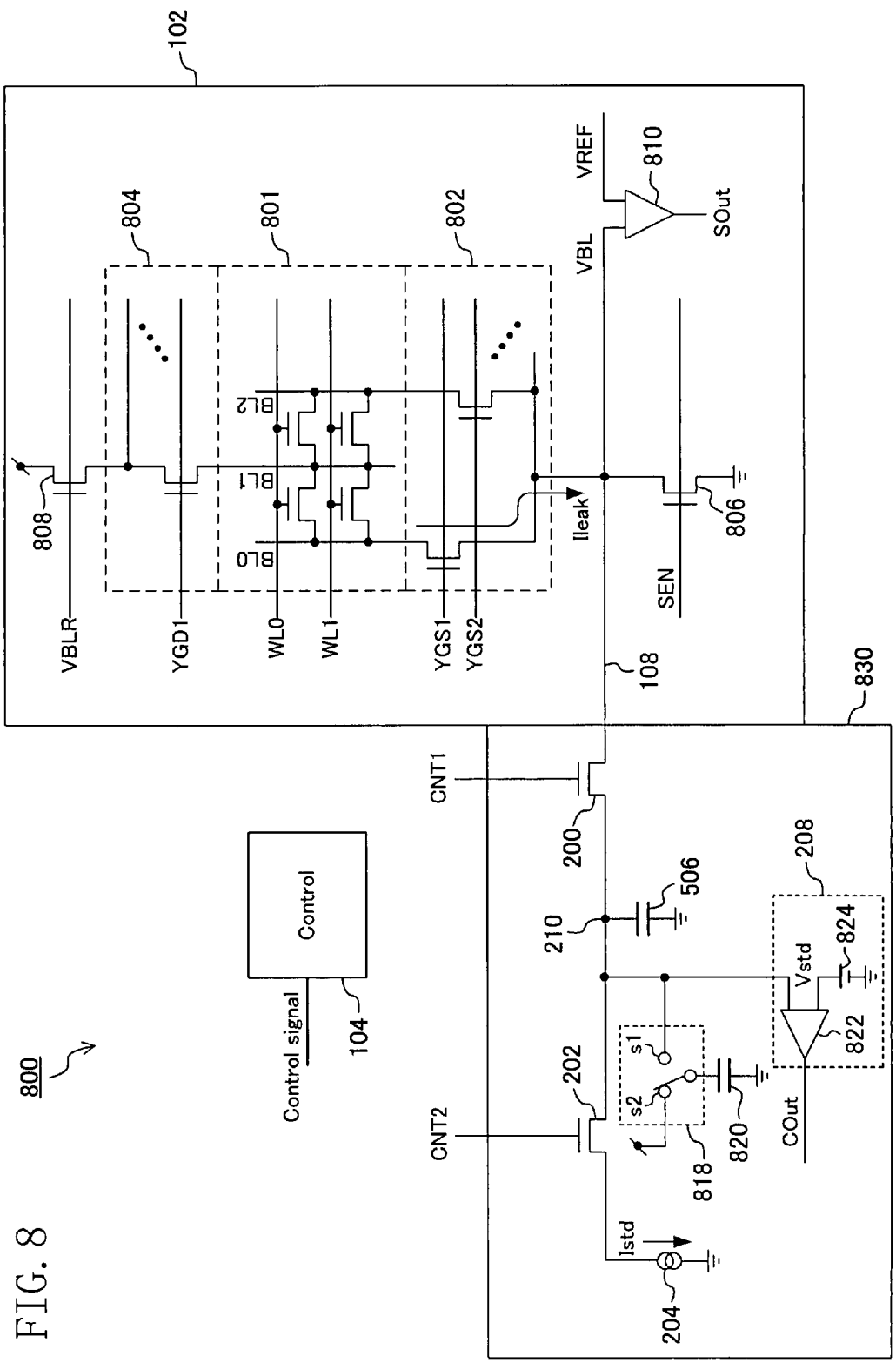
FIG. 8 is an exemplary schematic circuit diagram of a main part of a semiconductor memory according to Embodiment 3 of the present invention.

In Embodiment 3, the determination circuit is operated under appropriate bias conditions so as to realize a leak determination circuit capable of improving the determination precision. FIG. 8 shows an exemplary circuit configuration of the main part of a memory 800 of Embodiment 3.

Referring to FIG. 8, the data storage section 102 provided in the memory 800 employs the same virtual ground array arrangement as that of FIG. 21, wherein a selected source bit line in the data storage section 102 is connected to a bit line leak determination circuit 830 via the node 108.

In the bit line leak determination circuit 830, the transistors 200 and 202 to which the control signals CNT1 and CNT2 are connected, and the reference current source 204 connected to the transistor 202, are controlled similarly to, and operate similarly to, those shown in FIG. 2 and FIG. 5. Specifically, during the leak current determination operation, the leak current Ileak flows into the reference current source 204 when the leak current Ileak of the selected source bit line is less than the threshold current Istd, and the differential current (Ileak−Istd) between the leak current Ileak and the threshold current Istd flows into the capacitor 506 only when the leak current Ileak is greater than the threshold current Istd.

Figure 9:
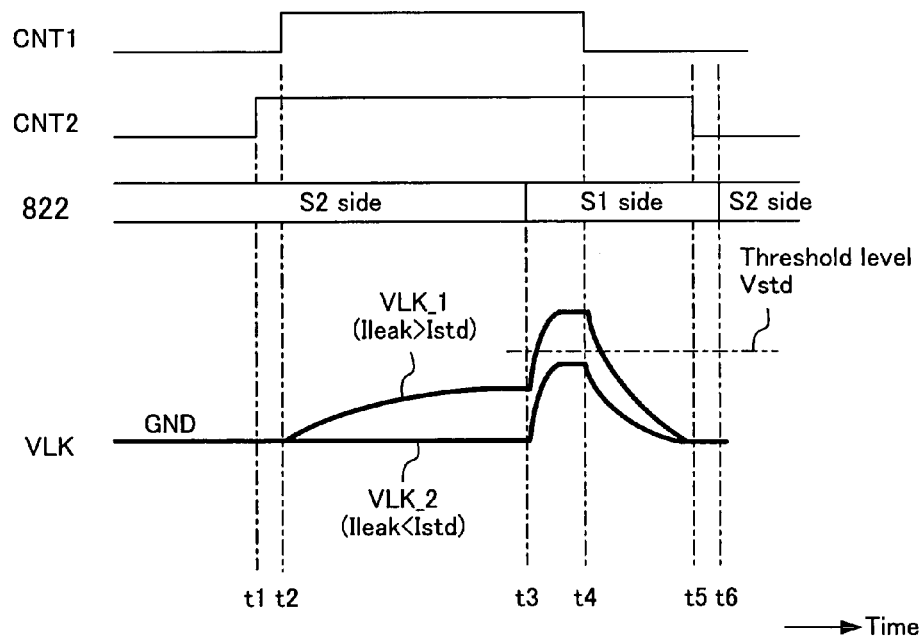
FIG. 9 is a timing diagram showing the bit line leak determination operation of the semiconductor memory shown in FIG. 8.

FIG. 9 shows a timing diagram of the leak current determination operation. Similar to the timing diagram shown in FIG. 6, in the operation starting from time t2, when the leak current Ileak is less than the threshold current Istd, the capacitor terminal potential VLK (the potential of the node 210 to which one end of the capacitor 506 is connected) remains at the ground potential as shown in (VLK_2), and when the leak current Ileak is greater than the threshold current Istd, the capacitor terminal potential VLK increases and gradually saturates over time as shown in (VLK_1) as the differential current (Ileak−Istd) is integrated by the capacitor 506.

Thus, the same operation as that of the timing diagram shown in FIG. 6 is performed until time t3. In order to determine the magnitude of the leak current by using the differential voltage between (VLK_1) and (VLK_2), the determination section 208 needs to be operated with bias conditions close to the ground potential as described above, thereby reducing the operation margin.

In order to avoid the reduction in the operation margin, the exemplary circuit configuration shown in FIG. 9 includes a capacitor 820 and a switch 818. Before time t3, the switch 818 is connected to s2 on the power supply node side, and the capacitor 820 is charged toward the power supply potential. At time t3, the switch 818 is moved from the s2 side to the s1 side, being the node to which the capacitor 506 is connected. Then, after time t3 of FIG. 9, the charge stored in the capacitor 820 is redistributed between the capacitor 820 and the capacitor 506, whereby the capacitor terminal potential VLK increases for both (VLK_1) and (VLK_2).

Figure 10:
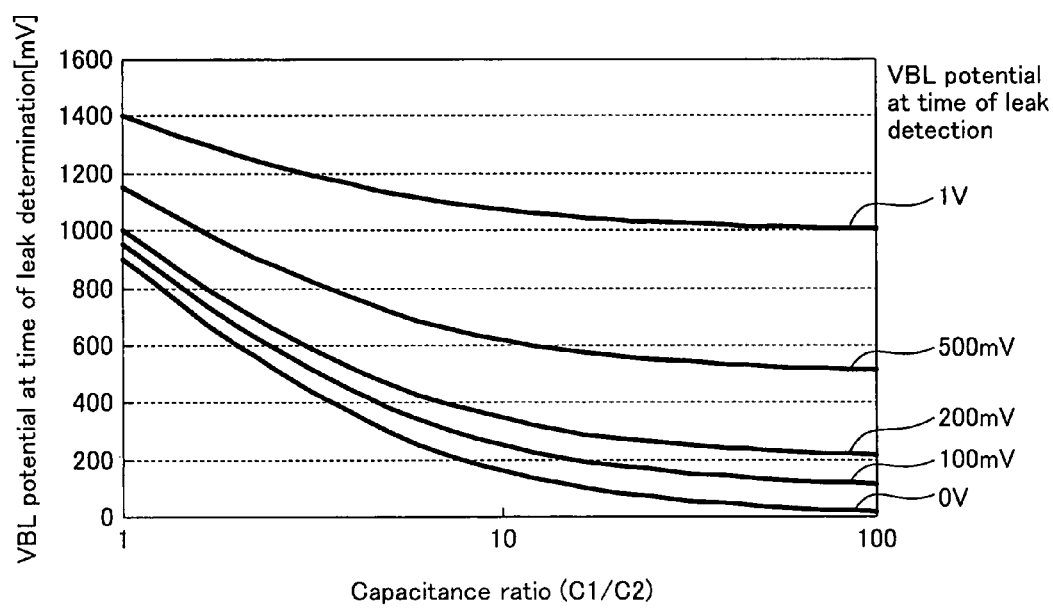
FIG. 10 shows the voltage conversion by an exemplary current determination circuit of the semiconductor memory shown in FIG. 8.

FIG. 10 shows how the capacitor terminal potential VLK (the VBL potential at the time of leak determination) after the switch 818 is moved to the s1 side is dependent on the capacitance ratio C1/C2 (C1: the capacitance of the capacitor 506, C2: the capacitance of the capacitor 820), wherein a parameter is the capacitor terminal potential VLK (the VBL potential at the time of leak detection) when the switch 818 is connected to the s2 side immediately before the switching at time t3.

As can be seen from FIG. 10, it is possible to increase the absolute potential while substantially maintaining the potential ratio between (VLK_1) and (VLK_2) by setting the capacitance ratio C1/C2 to an appropriate value.

Thus, by increasing the potential of (VLK_1) or (VLK_2), which is a value obtained by converting the differential current (Ileak−Istd) between the leak current Ileak and the threshold current Istd to a voltage, the threshold level Vstd, based on which the magnitude of the leak current is determined, can be set to a value shown in FIG. 9. A comparison between FIG. 9 and FIGS. 3 and 6 shows that the threshold level Vstd is set to be close to the ground potential in FIGS. 3 and 6, whereas the threshold level Vstd is set to a significantly higher level in FIG. 9 than in FIGS. 3 and 6. As shown in FIG. 8, the threshold level Vstd is given to a comparator 822 by a bias potential 824. The comparator 822 compares the threshold level Vstd with the potential of the node 210 (VLK_1 or VLK_2). Thus, according to the present embodiment, it is possible to determine the magnitude of the leak current through an operation of the comparator 822 under the appropriate bias conditions.

Upon completion of the leak current determination operation, the control signal CNT1 is brought to "L" at time t4 shown in FIG. 9 to thereby turn OFF the transistor 200, and the potential VLK of the node 210 is pulled out via a transistor 816. Then, the control signal CNT2 is brought to "L" at time t5 to thereby turn OFF the transistor 202, after which the switch 818 is moved to the power supply node side s2 at time t6, and the leak current determination operation cycle ends.

Embodiment 4

Embodiment 4 realizes bit line leak determination means with which the increase in the circuit scale is suppressed, by performing a bit line leak determination using a sense amplifier for reading out data stored in memory cells.

Figure 11:
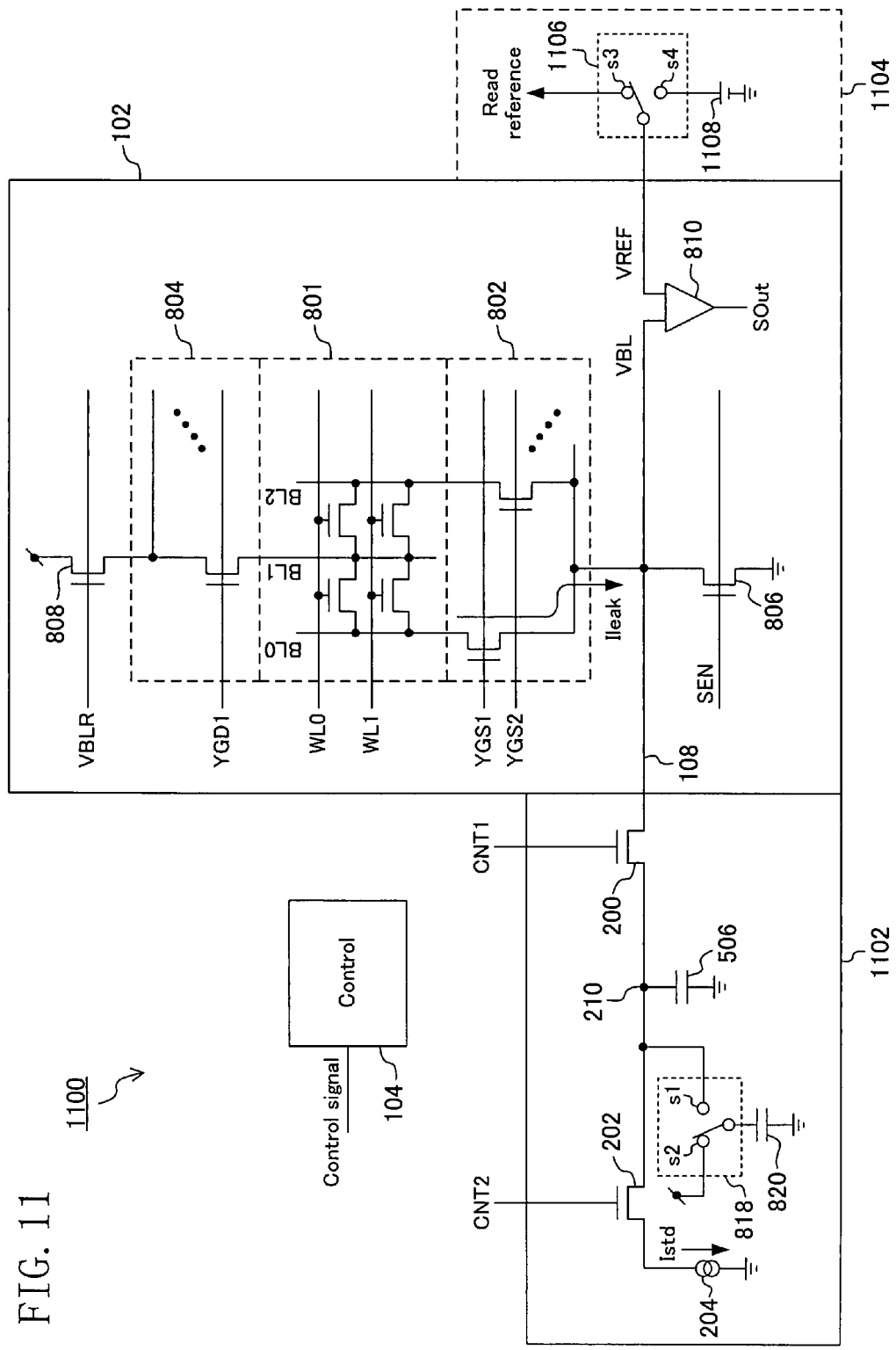
FIG. 11 is an exemplary schematic circuit diagram of a main part of a semiconductor memory according to Embodiment 4 of the present invention.

FIG. 11 shows an exemplary circuit configuration of the main part of a memory 1100 according to Embodiment 4, wherein the data storage section 102 is the same as that shown in FIG. 8.

The bit line leak determination circuit includes circuit blocks 1102 and 1104. The circuit block 1102 converts the leak current Ileak of the selected source bit line to a voltage. The circuit block 1104 supplies a bias potential with which the voltage converted by the circuit block 1102 is determined by the sense amplifier 810 for reading out stored data.

Figure 12:
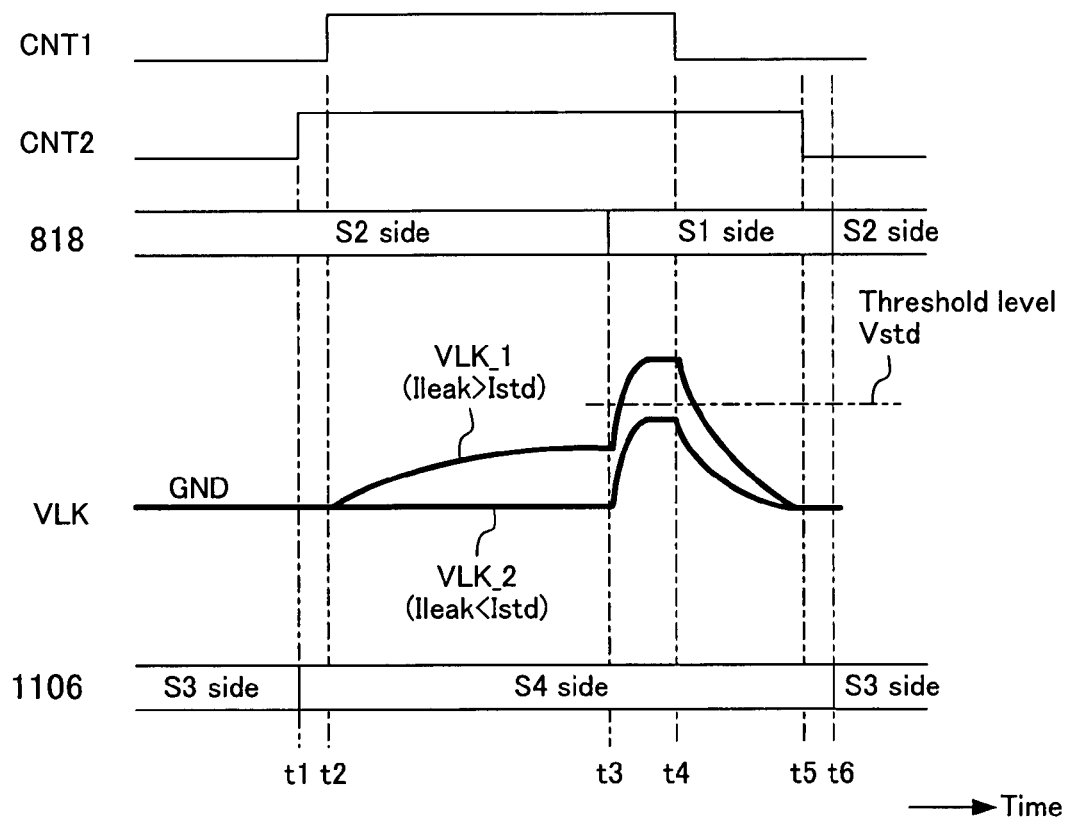
FIG. 12 is a timing diagram showing the bit line leak determination operation of the semiconductor memory shown in FIG. 11.

The circuit block 1102 is the same as the leak current determination circuit 830 shown in FIG. 8, except that the comparator 822 and the bias potential 824 are absent. The operation timing of the circuit block 1102 is shown in FIG. 12. If the control signals CNT1 and CNT2 and the switch 818 are controlled as shown in FIG. 9, the capacitor terminal potential VLK (the potential of the node 210 to which one end of the capacitor 506 is connected) will be of a value similar to that of FIG. 9.

As described above, the capacitor terminal potential VLK during the period t3-t4 of FIG. 12 (i.e., the input potential VBL to the sense amplifier 810) depends on the capacitance ratio C1/C2 as shown in FIG. 10, and can be set to a value suitable for the operation bias of the sense amplifier 810, which is designed for reading out data.

In order to determine the magnitude of the bit line leak current, a switch 1106 is moved from the s3 side (the read reference side) to the s4 side (the side of a bias potential 1108) at or before time t1 when the bit line leak determination operation starts, thus selecting the bias potential 1108 for leak current determination (the threshold level Vstd) as the potential VREF to be given to the reference node of the sense amplifier 810.

Then, at time t4, the capacitor terminal potential VLK (VLK_1 or VLK_2) and the bias potential 1108 (the threshold level Vstd) are compared with each other by means of the sense amplifier 810 to thereby output the determination result Sout.

At the point in time (t6) when the leak determination operation ends, the switch 1106 is moved to s3 (the read reference side) in preparation for a subsequent read operation.

According to Embodiment 4, it is possible to determine the bit line leak current by using the sense amplifier 810, which is designed for reading out data stored in memory cells. Therefore, it is no longer necessary for providing a dedicated determination circuit, thereby suppressing the increase in the circuit scale, and it is possible to simultaneously determine the bit line leak current for the same number of bit lines as the number of bits that can be read out simultaneously, thus reducing the amount of time required for the determination.

Embodiment 5

Figure 13:
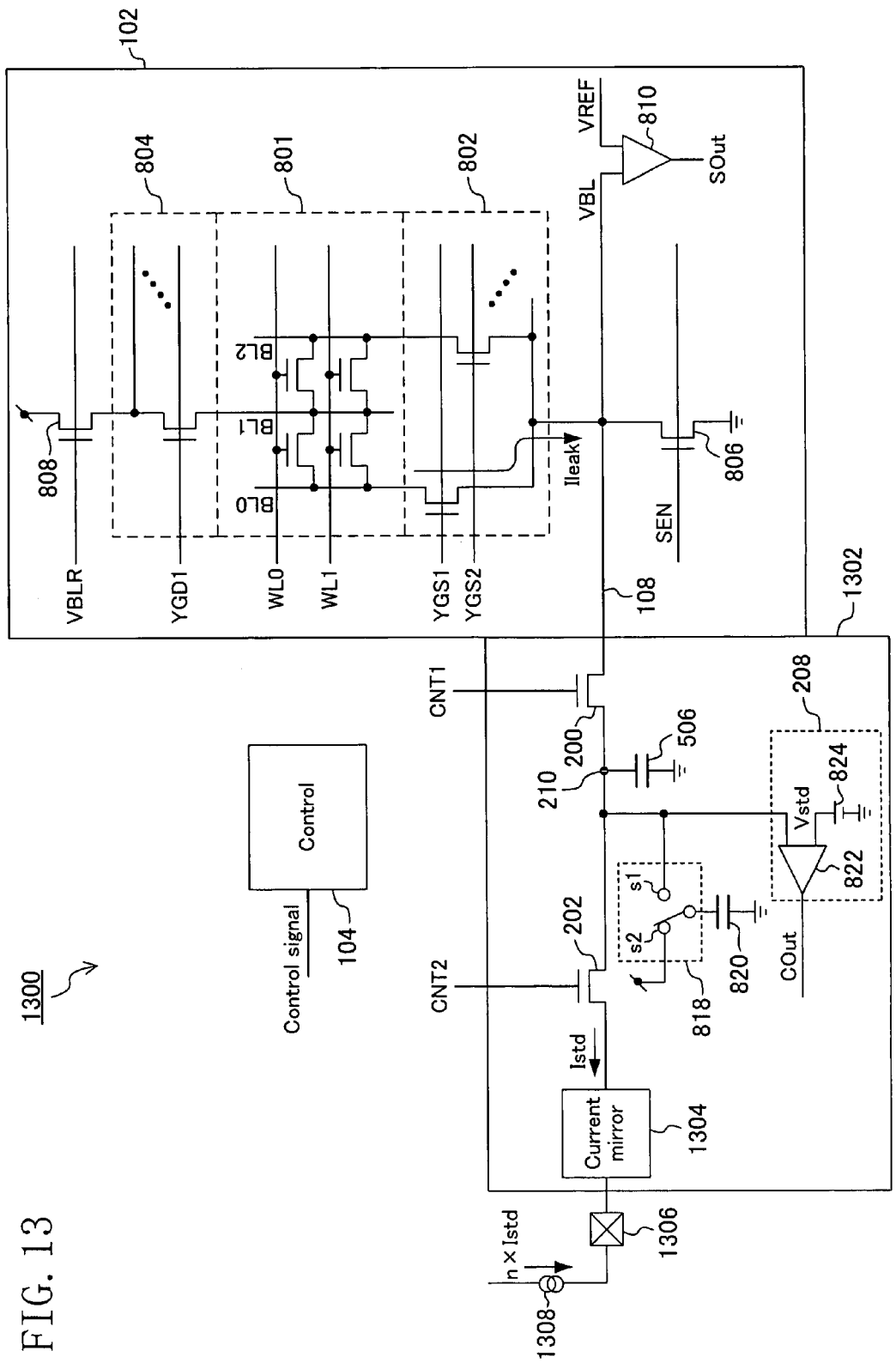
FIG. 13 is an exemplary schematic circuit diagram of a main part of a semiconductor memory according to Embodiment 5 of the present invention.

FIG. 13 shows an exemplary circuit configuration of the main part of a semiconductor memory 1300, in which the bit line leak can be determined by using a threshold current of a higher precision. The data storage section 102 of the semiconductor memory 1300 shown in FIG. 13 is the same as that shown in FIG. 8. A bit line leak determination circuit 1302 shown in FIG. 13 is different from the determination circuit 830 of FIG. 8 in that the threshold current Istd is produced by a reference current source 1308 and a current mirror. 1304 connected together via an external terminal 1306.

The bit line leak current to be determined is on the sub-μA level, and on-chip generation of the threshold current Istd with high precision requires a complicated circuit employing a current value trimming mechanism, or the like, and also requires a complicated mechanism for checking the generated current value.

Referring to FIG. 13, the current (n×Istd), based on which the threshold current Istd is to be generated, is applied to the external terminal 1306 by means of a current source 1308 (e.g., the current source of the test apparatus) outside the chip. The value of the applied current is not the threshold current Istd, which is a low current, but is (n×Istd), i.e., the threshold current Istd times n, in order to suppress the influence of noise, etc.

Figure 14:
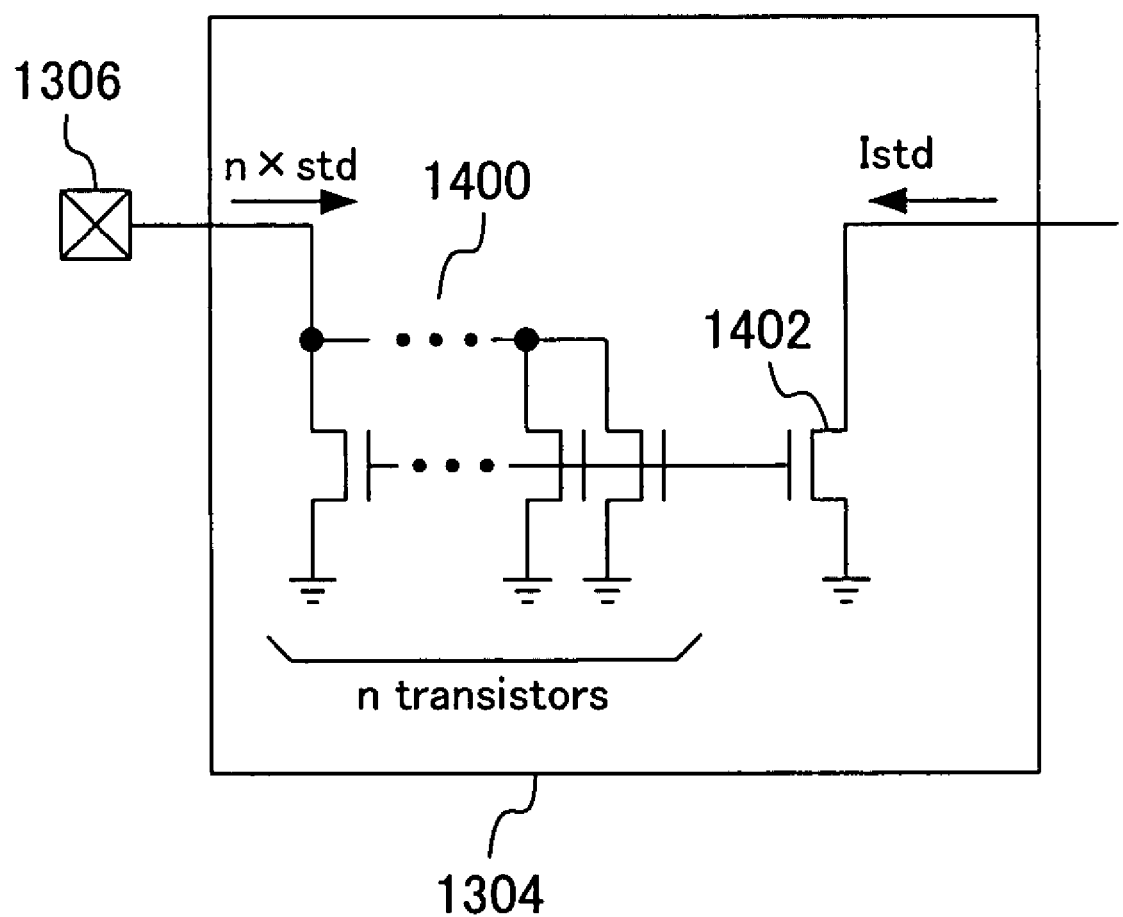
FIG. 14 shows an exemplary circuit configuration of a current mirror shown in FIG. 13.

The current mirror 1304 is a circuit for producing Istd from the applied current (n×Istd), i.e., the threshold current times n, and FIG. 14 shows a specific example of the circuit.

The current (n×Istd) applied via the external terminal 1306 is supplied to n transistors 1400 connected in parallel to one another, and the current Istd, i.e., the current (n×Istd) times 1/n, flows through a single transistor 1402 that is connected in current mirror connection to the transistors 1400. By using the current Istd flowing through the transistor 1402 as the threshold current in the determination operation at the bit line leak determination circuit 1302, the current flowing through the transistor 202 during the current determination operation will be the same as the current through the transistor 202 of FIG. 8. It is understood that it is then possible to realize the leak determination operation by the same timing operation as that shown in FIG. 9.

According to Embodiment 5, the threshold current Istd for the leak determination circuit 1302 can be generated with high precision by means of a simple circuit configuration, whereby it is possible to realize a high-precision bit line leak determination at low cost.

Embodiment 6

The preceding embodiments are all directed to bit line leak determination means that is realized by using the path, which is provided for reading out data in a memory of a virtual ground array arrangement employing the source read method. As described above, with a virtual ground array arrangement, bit line selection is made both on the source side and on the drain side, and it is possible to determine the current of the selected bit line on the drain side even with the source read method. The following embodiment is directed to a bit line leak current determination using the drain bit line.

Figure 15:
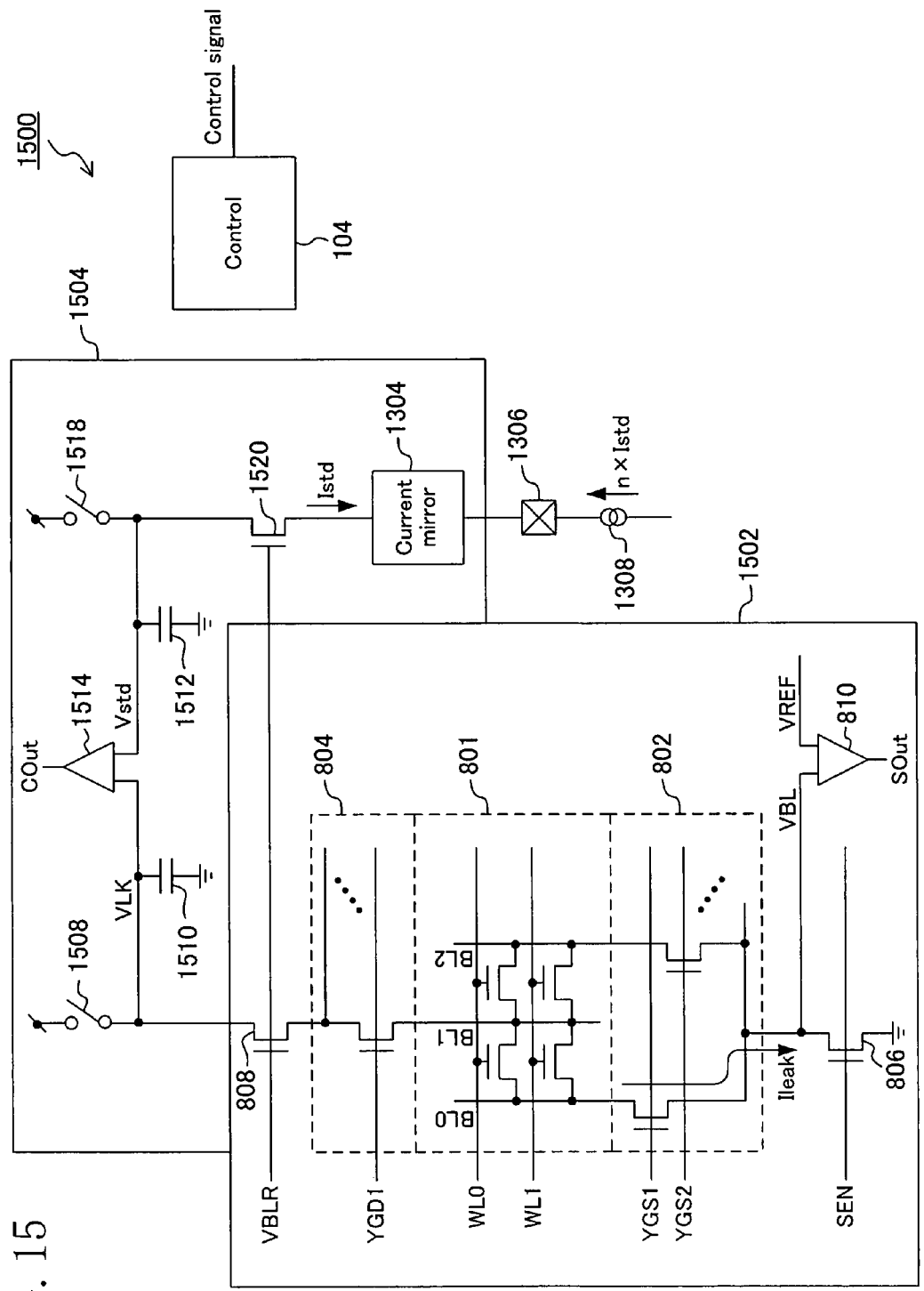
FIG. 15 is an exemplary schematic circuit diagram of a main part of a semiconductor memory according to Embodiment 6 of the present invention.

FIG. 15 shows an exemplary circuit configuration of the main part of a semiconductor memory 1500 performing a bit line leak determination on the drain side in a memory of a virtual ground array arrangement employing the source read method. A data storage section 1502 of FIG. 15 is different from the data storage section 102 shown in FIG. 8 in that the node connected to a leak determination circuit 1504 is serving as the drain of the bias transistor 808 for giving a read out voltage of about 1.3 V to the drain of the memory cell in a read operation, but not as the output of the column selection gate (S) 802 that selects a source bit line. Other circuit components are the same as those of the data storage section 102 shown in FIG. 8, and the circuit operates in the same manner when reading out data stored in the memory cell.

The drain of the transistor 808, which is connected to the leak determination circuit 1504, is connected to the power supply potential via a switch 1508, and a node that connects together the drain of the transistor 808 and the switch 1508 is connected to one end of a capacitor 1510 and also connected to one input of a comparator 1514.

The other input of the comparator 1514 is connected to a node that connects together a capacitor 1512, a switch 1518 and the drain of a transistor 1520. The other end of the switch 1518 is connected to the power supply potential, and the source of the transistor 1520 is connected to the current mirror 1304 as shown in FIG. 13, with the reference current source 1308 as shown in FIG. 13 being connected to the current mirror 1304 via the external terminal 1306.

As described above with reference to FIG. 13, in the bit line leak determination operation, the current source 1308 provides the flow of a current (n×Istd), i.e., the threshold current Istd times n, to the current mirror 1304, which in response operates to draw in the threshold current Istd from the transistor 1520.

Other than during the bit line leak determination operation (e.g., when reading out data from a memory cell), the switch 1508 and the switch 1518 are ON, whereby the capacitors 1510 and 1512 are charged to the power supply potential.

During the bit line leak determination operation, under control of the control circuit 104, the ground potential representing the "unselected state" is given to all the word lines WL0 and WL1, and the column selection gate (S) 802 and the column selection gate (D) 804 select a drain bit line and a source bit line, respectively, whose leak is to be determined, thereby selecting a group of memory cells (a column of memory cells) whose leak is to be determined.

Figure 16:
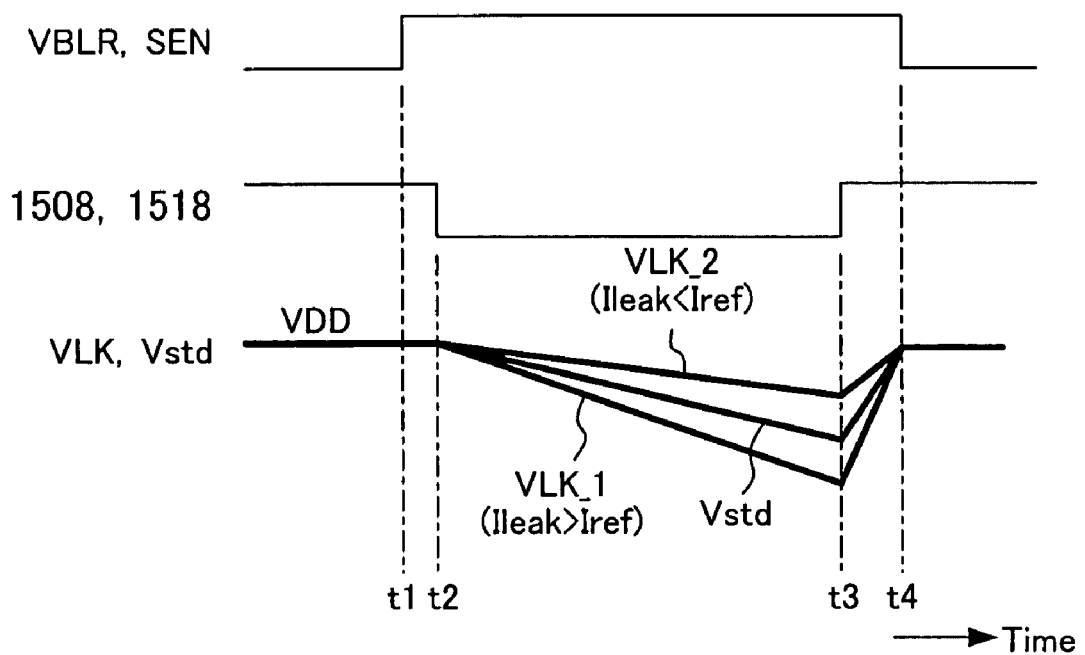
FIG. 16 is a timing diagram showing the bit line leak determination operation of the semiconductor memory shown in FIG. 15.

FIG. 16 shows a timing waveform of the bit line leak determination operation. At time t1, the signal VBLR given to the transistors 808 and 1520 and the signal SEN given to the transistor 806 are enabled. Thus, the transistor 806 is turned ON, whereby the selected source bit line BL0 or BL1 is brought to the ground potential and the transistor 808 gives a read voltage of about 1.3 V to the selected drain bit line BL1.

Since the switch 1508 and the switch 1518 are ON, the leak current of a group of memory cells (a column of memory cells) flows from the power supply potential to the ground potential via the selected drain bit line and the selected source bit line. Moreover, the threshold current Istd flows from the power supply potential to the current mirror 1304 via the switch 1518 and the transistor 1520.

At time t2, a signal is given to open the switch 1508 and the switch 1518, whereby the memory cell leak current is supplied from the charge stored in the capacitor 1510. Similarly, the threshold current Istd flowing via the transistor 1520 is supplied from the charge stored in the capacitor 1512.

Therefore, after time t2, the potential VLK of the node to which one end of the capacitor 1510 is connected and the potential Vstd of the node to which one end of the capacitor 1512 is connected decrease gradually. In response to the decrease in the potential Vstd by the threshold current Istd, the potential VLK will be as shown in (VLK_1) if the leak current of the selected bit line is greater than the threshold current (Ileak>Istd) and a shown in (VLK_2) if the leak current of the selected bit line is less than the threshold current (Ileak<Istd) as shown in FIG. 16.

The potentials Vstd and VLK are compared with each other at the comparator 1514, and the output Cout of the comparator 1514 at time t3 such that the potential difference between Vstd and (VLK_1 or VLK_2) is an appropriate value is used as the bit line leak determination result.

According to Embodiment 6, there will be no influence on the operation of the memory cell array 801 as long as the potential VLK is greater than or equal to the potential (herein about 1.3 V) applied to the drain of the memory cell. Therefore, the operating bias condition of the comparator 1514 can be set to any appropriate value in the range from 1.3 V to the power supply voltage. Thus, it is possible to ensure a sufficient circuit operation margin, and to thereby realize a stable operation.

When reading out data stored in the memory cell in a virtual ground array arrangement, there is influence from an adjacent bit line being in an unselected state and adjacent to the selected memory cell. Therefore, it is necessary to realize an operation such that the influence from the unselected adjacent bit line is suppressed, and a necessary action is taken on an unselected source bit line adjacent to the selected source bit line.

On the other hand, in the bit line leak determination operation, the unselected source bit line is open, whereby even if a leak current flows into the unselected source bit line, the potential of the unselected source bit line will increase. As described above, the increase in the source potential has the effect of suppressing the leak current. Thus, the determination precision is not deteriorated when the bit line leak in a virtual ground array arrangement of the source read method is determined based on the current flowing through the drain bit line.

Moreover, the leak determination can be done by directly comparing Vstd with VLK, which are voltage-converted values of the threshold current Istd and the bit line leak current Ileak, respectively, whereby it is possible to realize a determination with high precision.

Embodiment 7

Figure 17:
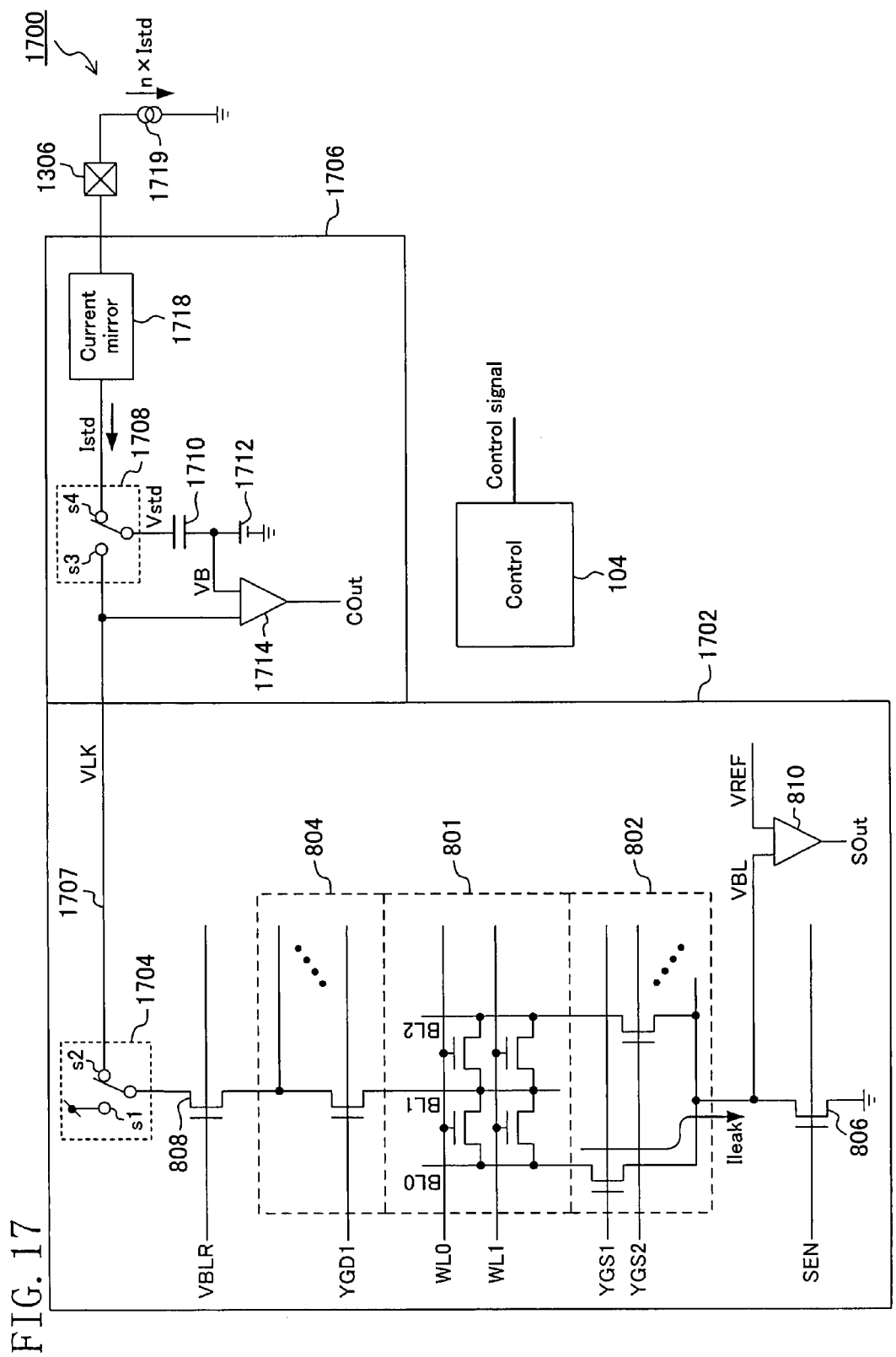
FIG. 17 is an exemplary schematic circuit diagram of a main part of a semiconductor memory according to Embodiment 7 of the present invention.

FIG. 17 shows an exemplary schematic configuration of the main part of a memory 1700 of a virtual ground array arrangement employing the source read method, in which the drain-side bit line leak current determination is realized by a simpler circuit configuration.

A data storage section 1702 of the memory 1700 shown in FIG. 17 is different from the data storage section 1502 of FIG. 15 in that the drain of the transistor 808 is connected to a switch 1704 of a 3-terminal configuration. Based on the position of the switch 1704, the drain of the transistor 808 is connected to a bit line leak determination circuit 1706 on the s2 side during the bit line leak determination operation, and to the power supply line on the s1 side other than during the bit line leak determination operation (e.g., in a read operation).

The bit line leak determination circuit 1706 includes a capacitor 1710 connected directly to a bias potential 1712, a current mirror 1718 for supplying a charge to the capacitor 1710 via a switch 1708, and a comparator 1714 for comparing the bias potential 1712 with the potential of a node 1707.

Figure 18:
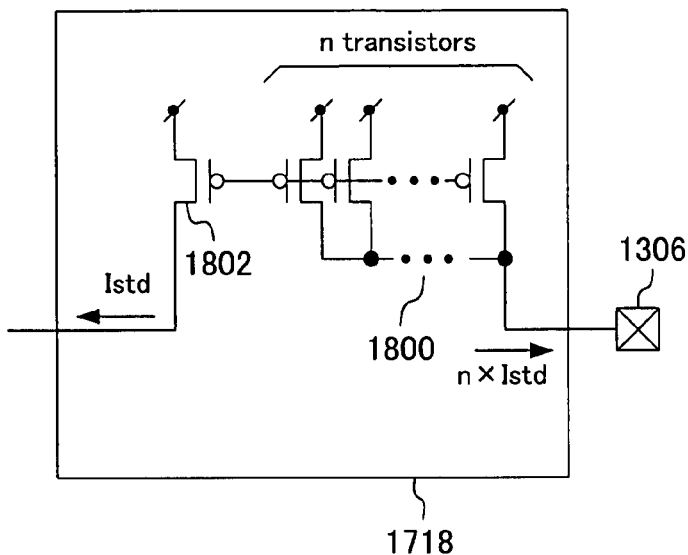
FIG. 18 shows an exemplary circuit configuration of a current mirror shown in FIG. 17.

FIG. 18 shows a specific example of the circuit of the current mirror 1718. The circuit example is different from that of the current mirror 1304 shown in FIG. 14 in that p-channel transistors 1800 and 1802 are used, instead of the n-channel transistors 1400 and 1402, as transistors of the current mirror.

A current source 1719 is connected to n transistors 1800, which are connected in parallel to one another, for drawing in the current (n×Istd), i.e., the reference current Istd times n, via the external terminal 1306. The current Istd, i.e., the current (n×Istd) times 1/n, flows through a single transistor 1802 that is connected in current mirror connection to the transistors 1800, and the current value Istd is used as the leak threshold current.

Figure 19:
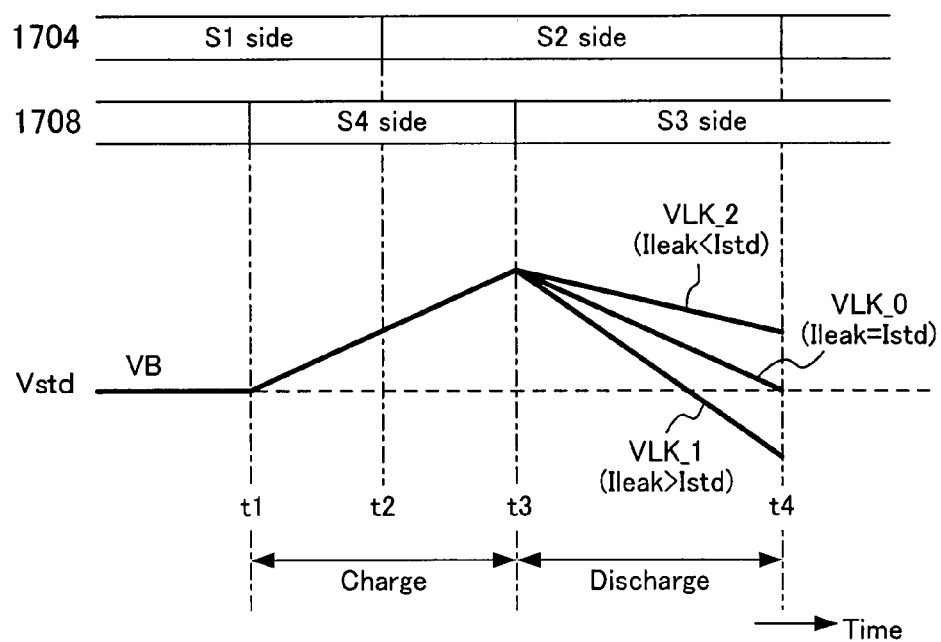
FIG. 19 is a timing diagram showing the bit line leak determination operation of the semiconductor memory shown in FIG. 17.

FIG. 19 shows the operation timing of the bit line leak determination in the memory 1700 shown in FIG. 17. During the bit line leak determination operation, under control of the control circuit 104, the ground potential representing the "unselected state" is given to all the word lines WL0 and WL1, and the column selection gate (S) 802 and the column selection gate (D) 804 select a drain bit line and a source bit line, respectively, whose leak is to be determined, thereby selecting a group of memory cells (a column of memory cells) whose leak is to be determined.

At time t1 of FIG. 19, the switch 1708 is connected to the current mirror 1718 on the s4 side. Thus, the capacitor 1710 is charged with the charge from the current mirror 1718, and the potential Vstd on one end (on the side of the switch 1708) of the capacitor 1710 increases from the bias potential VB. At this point, the switch 1704 is connected to the power supply line on the s1 side, and the leak current Ileak of a group of selected memory cells is supplied from the power supply line via the switch 1704.

At time t2 when the capacitor 1710 is being charged with the charge from the current mirror 1718, the switch 1704 is moved from the s1 side to the s2 side, in which state there is no source of leak current to the group of selected memory cells.

At time t3, the switch 1708 is moved from the s4 side (the current mirror 1718) to the s3 side (the node 1707). In this state, the leak current of the selected memory cell is supplied from the charge stored in the capacitor 1710, whereby the capacitor terminal potential Vstd decreases.

At time t4, i.e., when an amount of time equal to the charging period t1-t3 (during which the capacitor 1710 is charged with the current Istd supplied from the current mirror 1304) has elapsed since time t3, the capacitor terminal potential Vstd will be (VLK_0), (VLK_1) or (VLK_2), as shown in FIG. 19, depending on whether the leak current Ileak of the group of selected memory cells is equal to, greater than, or less than, the threshold current Istd.

By comparing the bias potential VB (=the capacitor terminal potential Vstd before time t1) with the capacitor terminal potential Vstd (VLK_0, VLK_1 or VLK_2) by means of the comparator 1714 at time t4, it is possible to determine the magnitude relationship between the leak current Ileak of the group of selected memory cells and the threshold current Istd.

According to Embodiment 7, the operating bias condition of the comparator can be set to an appropriate value with a simple circuit configuration as in Embodiment 6, and it is therefore possible to ensure a sufficient circuit operation margin, and to thereby realize a stable operation. Moreover, the leak determination can be made by directly comparing Vstd and VLK with each other, which are voltage values obtained by converting the threshold current Istd and the bit line leak current Ileak, respectively, whereby it is possible to realize a determination with high precision.

The present invention is quite useful in determining a bit line low current in a miniaturized semiconductor device (a semiconductor device including a memory cell array, e.g., a non-volatile memory such as a flash memory, an EEPROM or a ferroelectric memory, or a volatile memory such as a DRAM or an SRAM).

What is claimed is:

1. A semiconductor memory, including a plurality of word lines, a plurality of bit lines, a plurality of memory cells provided at intersections between the plurality of word lines and the plurality of bit lines, and a sense amplifier for reading out what is stored in the memory cells, the semiconductor memory comprising:
   bit line selection means for selecting a bit line from among the plurality of bit lines;
   switch means for turning ON/OFF a current of the bit line selected by the bit line selection means;
   current generation means for generating a threshold current;
   means for extracting a differential current between the selected bit line current and the threshold current when a value of the selected bit line current is greater than that of the threshold current;
   voltage conversion means for converting the differential current to a voltage; and
   determination means for determining a magnitude relationship between the threshold current and the selected bit line current based on an output voltage from the voltage conversion means.

2. The semiconductor memory of claim 1, wherein the bit line selection means includes:
   first bit line selection means for selecting a bit line to which a drain of the memory cell is connected; and
   second bit line selection means for selecting a bit line to which a source of the memory cell is connected.

3. The semiconductor memory of claim 2, wherein the sense amplifier is connected to an output of the second bit line selection means.

4. The semiconductor memory of claim 1, wherein the voltage conversion means includes resistor means into which the differential current flows.

5. The semiconductor memory of claim 1, wherein the voltage conversion means includes means for integrating the differential current.

6. The semiconductor memory of claim 5, wherein the integration means includes a capacitor into which the differential current flows.

7. The semiconductor memory of claim 1, wherein the current generation means includes means (a) for generating a threshold current based on a current applied to an external terminal.

8. The semiconductor memory of claim 7, wherein the means (a) includes means for multiplying the current applied to the external terminal by a coefficient.

9. The semiconductor memory of claim 1, wherein the determination means includes a comparator for comparing the output voltage from the voltage conversion means with a threshold voltage.

10. The semiconductor memory of claim 1, wherein the bit line current is a leak current that flows through a bit line when the plurality of word lines are all unselected.

11. A semiconductor memory, including a plurality of word lines, a plurality of bit lines, a plurality of memory cells provided at intersections between the plurality of word lines and the plurality of bit lines, and a sense amplifier for reading out what is stored in the memory cells, the semiconductor memory comprising:
   bit line selection means for selecting a bit line from among the plurality of bit lines;
   switch means for turning ON/OFF a current of the bit line selected by the bit line selection means;
   current generation means for generating a threshold current;

means for extracting a differential current between the selected bit line current and the threshold current when a value of the selected bit line current is greater than that of the threshold current;
first voltage conversion means for converting the differential current to a voltage;
second voltage conversion means for converting an output from the first voltage conversion means; and
determination means for determining a magnitude relationship between the threshold current and the selected bit line current based on an output voltage from the second voltage conversion means.

12. The semiconductor memory of claim 11, wherein the determination means includes a comparator for comparing the output voltage from the voltage conversion means with a threshold voltage.

13. The semiconductor memory of claim 11, wherein the bit line selection means includes:
first bit line selection means for selecting a bit line to which a drain of the memory cell is connected; and
second bit line selection means for selecting a bit line to which a source of the memory cell is connected.

14. The semiconductor memory of claim 13, wherein the sense amplifier is connected to an output of the second bit line selection means.

15. The semiconductor memory of claim 11, wherein:
the first voltage conversion means includes means for integrating the differential current by a first capacitor; and
the second voltage conversion means includes means for redistributing a charge stored in a second capacitor and that of the first capacitor.

16. The semiconductor memory of claim 11, wherein the current generation means includes means (a) for generating a threshold current based on a current applied to an external terminal.

17. The semiconductor memory of claim 16, wherein the means (a) includes means for multiplying the current applied to the external terminal by a coefficient.

18. The semiconductor memory of claim 11, wherein the bit line current is a leak current flowing through a bit line when the plurality of word lines are all unselected.

19. A semiconductor memory, including a plurality of word lines, a plurality of bit lines, a plurality of memory cells provided at intersections between the plurality of word lines and the plurality of bit lines, and a sense amplifier for reading out what is stored in the memory cells, the semiconductor memory comprising:
bit line selection means for selecting a bit line from among the plurality of bit lines;
switch means for turning ON/OFF a current of the bit line selected by the bit line selection means;
current generation means for generating a threshold current;
means for extracting a differential current between the selected bit line current and the threshold current when a value of the selected bit line current is greater than that of the threshold current;
first voltage conversion means for converting the differential current to a voltage;
second voltage conversion means for converting an output from the first voltage conversion means;
switching means for switching a reference voltage of the sense amplifier from one to another; and
determination means for determining a magnitude relationship between the threshold current and the selected bit line current based on an output voltage from the second voltage conversion means.

20. The semiconductor memory of claim 19, wherein the bit line selection means includes:
first bit line selection means for selecting a bit line to which a drain of the memory cell is connected; and
second bit line selection means for selecting a bit line to which a source of the memory cell is connected.

21. The semiconductor memory of claim 20, wherein the sense amplifier is connected to an output of the second bit line selection means.

22. The semiconductor memory of claim 19, wherein:
the first voltage conversion means includes means for integrating the differential current by a first capacitor; and
the second voltage conversion means includes means for redistributing a charge stored in a second capacitor and that of the first capacitor.

23. The semiconductor memory of claim 19, wherein the current generation means includes means (a) for generating a threshold current based on a current applied to an external terminal.

24. The semiconductor memory of claim 23, wherein the means (a) includes means for multiplying the current applied to the external terminal by a coefficient.

25. The semiconductor memory of claim 19, wherein the switching means includes:
bias application means; and
means for selectively giving a bias from the bias application means or a read reference as a reference voltage of the sense amplifier.

26. The semiconductor memory of claim 19, wherein the bit line current is a leak current that flows through a bit line when the plurality of word lines are all unselected.

27. A method for determining a bit line current of a semiconductor memory, the semiconductor memory including:
a plurality of word lines;
a plurality of bit lines;
a memory cell array of a virtual ground array arrangement including a plurality of memory cells provided at intersections between the plurality of word lines and the plurality of bit lines;
first bit line selection means for selecting a bit line to which a drain of the memory cell is connected;
second bit line selection means for selecting a bit line to which a source of the memory cell is connected; and
a sense amplifier for reading out what is stored in the memory cell connected to an output of the second bit line selection means, the method comprising:
a first bit line selection step of selecting, by means of the first bit line selection means, a bit line to which a drain of the memory cell is connected according to an input address;
a second bit line selection step of selecting, by means of the second bit line selection means, a bit line to which a source of the memory cell is connected according to the input address;
a step of grounding the bit line selected by the second bit line selection step; and
a step of determining a magnitude of a current flowing through the bit line selected by the first bit line selection step.

28. The method for determining a bit line current of a semiconductor memory of claim 27, wherein the step of determining a magnitude of the bit line current includes:
a step of charging a first capacitor and a second capacitor;
a step of supplying a threshold current from a charge stored in the second capacitor while supplying the bit line current from a charge stored in the first capacitor; and a step of comparing a terminal potential of the first capacitor with a terminal potential of the second capacitor.

29. The method for determining a bit line current of a semiconductor memory of claim 27, wherein the step of determining the bit line current includes:
  a step of charging a third capacitor with a threshold current;
  a step of supplying a bit line current from the third capacitor; and
  a step of determining a potential of a terminal of the third capacitor.

30. The method for determining a bit line current of a semiconductor memory of claim 27, wherein the bit line current is a leak current that flows through a bit line when the plurality of word lines are all unselected.

31. A semiconductor memory, including: a plurality of word lines; a plurality of bit lines; and a memory cell array of a virtual ground array arrangement including a plurality of memory cells provided at intersections between the plurality of word lines and the plurality of bit lines, the semiconductor memory comprising:
  first bit line selection means for selecting a bit line to which a drain of the memory cell is connected according to an input address;
  second bit line selection means for selecting a bit line to which a source of the memory cell is connected according to the input address;
  a sense amplifier for reading out what is stored in the memory cell connected to an output of the second bit line selection means;
  means for grounding the bit line selected by the second bit line selection means; and
  means for determining a magnitude of a current flowing through the bit line selected by the first bit line selection means.

32. The semiconductor memory of claim 31, wherein the means for determining a magnitude of the bit line current includes:
  a first switch for turning ON/OFF a current path between a bit line selected by the first bit line selection means and a power supply potential;
  a first capacitor connected to the first switch;
  threshold current generation means;
  a second switch for turning ON/OFF a current path between the threshold current generation means and a power supply potential;
  a second capacitor connected to the second switch; and
  a comparison means for comparing a terminal potential of the first capacitor with a terminal potential of the second capacitor.

33. The semiconductor memory of claim 32, wherein the threshold current generation means includes means (a) for generating a threshold current based on a current applied to an external terminal.

34. The semiconductor memory of claim 33, wherein the means (a) includes means for multiplying the current applied to the external terminal by a coefficient.

35. The semiconductor memory of claim 34, wherein the means for multiplying the current by a coefficient includes a current mirror.

36. The semiconductor memory of claim 31, wherein the means for determining a magnitude of the bit line current includes:
  threshold current generation means;
  a third capacitor to which the threshold current generation means is connected via a third switch;
  a fourth switch for switching between a position where a current supply source of the bit line selected by the first bit line selection means is a power supply potential and another position where the current supply source is a charge stored in the third capacitor; and
  comparison means for comparing a potential of a terminal of the third capacitor.

37. The semiconductor memory of claim 36, wherein the threshold current generation means includes means (a) for generating a threshold current based on a current applied to an external terminal.

38. The semiconductor memory of claim 37, wherein the means (a) includes means for multiplying the current applied to the external terminal by a coefficient.

39. The semiconductor memory of claim 38, wherein the means for multiplying the current by a coefficient includes a current mirror.

40. The semiconductor memory of claim 31, wherein the bit line current is a leak current that flows through a bit line when the plurality of word lines are all unselected.

41. A semiconductor low current determination device for comparing a magnitude of a threshold current with that of a current being measured, the device comprising:
  switch means for turning ON/OFF the current being measured;
  current generation means for generating a threshold current;
  means for extracting a differential current between the current being measured and the threshold current when a value of the current being measured is greater than that of the threshold current;
  voltage conversion means for converting the differential current to a voltage; and
  determination means for determining a magnitude relationship between the threshold current and the current being measured based on an output voltage from the voltage conversion means,
  wherein the current generation means includes means (a) for generating a threshold current based on a current applied to an external terminal, and
  wherein the means (a) includes means for multiplying the current applied to the external terminal by a coefficient.

* * * * *